(12) United States Patent
Okada

(10) Patent No.: US 7,944,010 B2
(45) Date of Patent: May 17, 2011

(54) ELECTROMAGNETIC WAVE DETECTING ELEMENT

(75) Inventor: Yoshihiro Okada, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 259 days.

(21) Appl. No.: 12/393,038

(22) Filed: Feb. 26, 2009

(65) Prior Publication Data
US 2009/0218646 A1    Sep. 3, 2009

(30) Foreign Application Priority Data

Feb. 29, 2008  (JP) ................... 2008-050610
Aug. 15, 2008  (JP) ................... 2008-209180

(51) Int. Cl.
*H01L 31/0224* (2006.01)
*H01L 31/02* (2006.01)

(52) U.S. Cl. .......... 257/428; 257/E31.124; 257/E31.113

(58) Field of Classification Search ............ 257/428
See application file for complete search history.

(56) References Cited

U.S. PATENT DOCUMENTS
5,777,355 A    7/1998 Possin et al.

FOREIGN PATENT DOCUMENTS
JP    2000-137080    5/2000

*Primary Examiner* — Jarrett J Stark
*Assistant Examiner* — Lawrence Tynes, Jr.
(74) *Attorney, Agent, or Firm* — Solaris Intellectual Property Group, PLLC

(57) ABSTRACT

The present invention is to provide an electromagnetic wave detecting element that can suppress a decrease in utilization efficiency of electromagnetic waves at sensor portions. An upper electrode of each of plural sensor portions, that are provided in correspondence with intersection portions of plural scan lines and plural signal lines disposed to intersect one another, is electrically connected to any other adjacent upper electrode. At each group of sensor portions whose upper electrodes are electrically connected, a common electrode line and the upper electrode of any sensor portion belonging to that group of sensor portions are connected by a contact pad via a contact hole formed in an insulating film and at a connection place of a number that is less than a number of sensor portions belonging to that group of sensor portions.

12 Claims, 15 Drawing Sheets

FIG. 5A
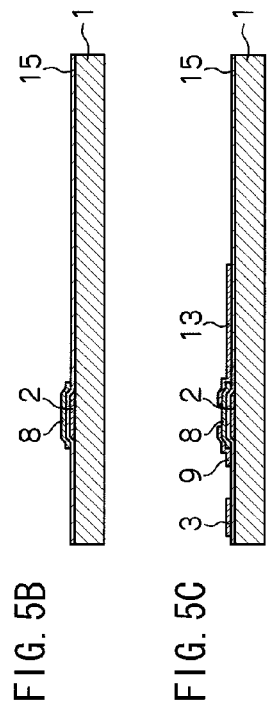
FIG. 5B
FIG. 5C
FIG. 5D
FIG. 5E
FIG. 5F
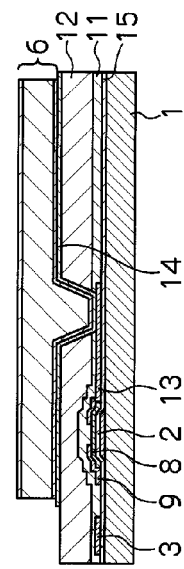
FIG. 5G
FIG. 5H
FIG. 5I
FIG. 5J

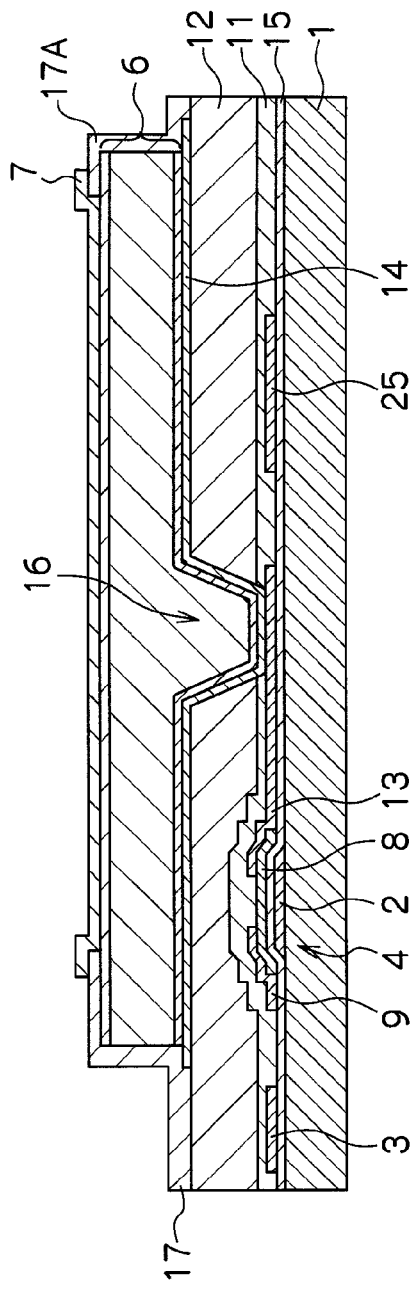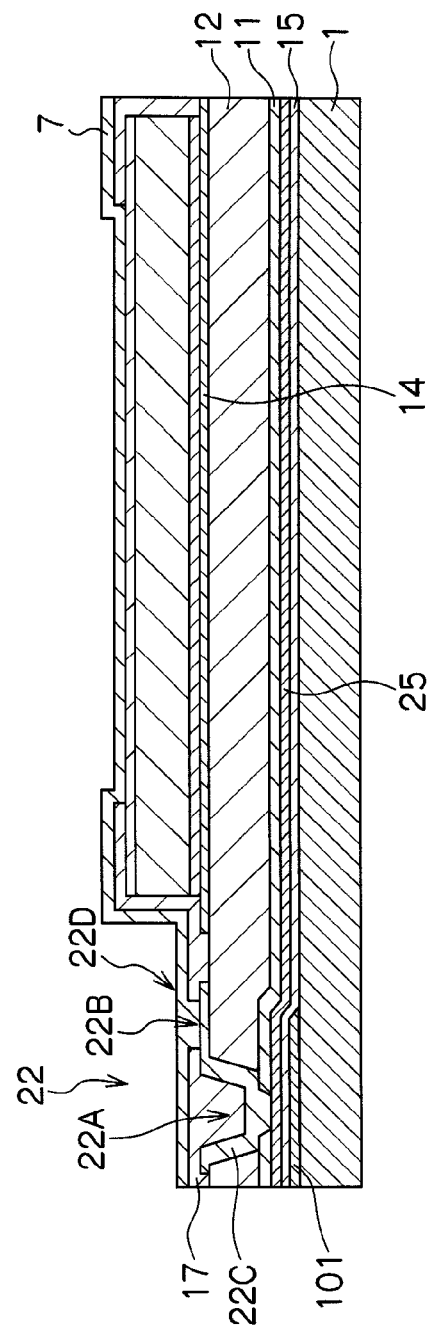

ELECTROMAGNETIC WAVE DETECTING ELEMENT

CROSS-REFERENCE TO RELATED APPLICATION

This application claims priority under 35 USC 119 from Japanese Patent Application No. 2008-050610 and No. 2008-209180, the disclosure of which is incorporated by reference herein.

BACKGROUND OF THE INVENTION

1. Field of the Invention

The present invention relates to an electromagnetic wave detecting element. In particular, the present invention relates to an electromagnetic wave detecting element that uses a TFT active matrix substrate that detects an image and at which sensor portions are provided in correspondence with respective intersection portions of plural scan lines and plural signal lines that are disposed so as to intersect one another.

2. Description of the Related Art

Radiation image detection devices such as FPDs (flat panel detectors), in which an X-ray sensitive layer is disposed on a TFT (thin film transistor) active matrix substrate and that can convert X-ray information directly into digital data, and the like, have been put into practice in recent years. As compared with a conventional imaging plate, an image can be confirmed immediately at an FPD. Further, the FPD has the advantage that video images as well can be confirmed. Therefore, the popularization of FPDs has advanced rapidly.

Various types of radiation image detection devices are proposed. For example, there is a direct-conversion-type radiation image detection device that converts radiation directly into charges and accumulates the charges. Moreover, there is an indirect-conversion-type radiation image detection device that once converts radiation into light at a scintillator of CsI:Tl, GOS (Gd2O2S:Tb), or the like, and, at semiconductor layer, converts the converted light into charges and accumulates the charges (see, for example, Japanese Patent Application Laid-Open (JP-A) No. 2000-137080).

As an example, a plan view showing the structure of one pixel unit of an electromagnetic wave detecting element 10' that is used in an indirect-conversion-type radiation image detection device, is shown in FIG. 12. Further, a cross-sectional view along line A-A of FIG. 12 is shown in FIG. 13.

As shown in FIG. 12, sensor portions 103' are provided at the electromagnetic wave detecting element 10', in correspondence with the respective intersection portions of plural scan lines 101' and plural signal lines 3' that are disposed so as to intersect one another.

As shown in FIG. 13, the sensor portion 103' includes a semiconductor layer 6', an upper electrode 7', and a lower electrode 14'. The semiconductor layer 6' generates charges due to light being illuminated. The upper electrode 7' is formed by a light-transmissive, electrically-conductive member at an illumination surface side of the semiconductor layer 6' at which light is illuminated, and applies bias voltage to the semiconductor layer 6'. The lower electrode 14' is formed at the light non-illumination surface side of the semiconductor layer 6', and collects charges that are generated at the semiconductor layer 6'.

At the electromagnetic wave detecting element 10', common electrode lines 25', that supply bias voltage to the upper electrodes 7', are disposed at the upper layer of the semiconductor layer 6'. The resistance of the common electrode lines 25' must be made to be low in order to supply charges. Therefore, the common electrode lines 25' are formed by using a low-resistance wiring material of Al or Cu, or material including Al or Cu.

U.S. Pat. No. 5,777,355 discloses a technique of connecting respective upper electrodes that are formed from transparent, electrically-conductive members, so as to have them function also as common electrode lines.

However, as shown in FIG. 13, if the common electrode lines 25' are disposed at the illumination surface sides of the semiconductor layer 6', contact portions 27' are needed in order to connect the common electrode lines 25' and the upper electrodes 7'. However, the efficiency of utilization of light decreases due to the contact portions 27'.

Contact holes 27A' are disposed at the centers of the contact portions 27'. Further, in order to keep the contact resistance between the common electrode lines 25' and the upper electrodes 7' low, and because of the fabrication yield of the photolithographic process at the time of manufacturing the electromagnetic wave detecting element 10', the size of the contact holes 27A' must be greater than or equal to 4×4 µm, and preferably greater than or equal to 8×8 µm. Moreover, at the contact portions 27', contact pads 27B' that electrically connect the common electrode lines 25' and the upper electrodes 7' must be made to be larger than the contact holes 27A'. Therefore, the size of the contact portions 27' must be greater than 10×10 µm, and preferably greater than or equal to 15×15 µm.

Here, by using the technique disclosed in aforementioned U.S. Pat. No. 5,777,355, the upper electrodes 7', that are formed from transparent, electrically-conductive members, are respectively connected and made to function also as common electrode lines.

However, usually, the resistivity of a transparent, electrically-conductive member is large, and is 50 to 200 times that of a low-resistance wiring material. Therefore, if the upper electrodes 7' are respectively connected and made to function also as common electrode lines, the wiring load (resistance, capacity) of the common electrode lines increases, and the desired response cannot be realized. Thus, the upper electrodes 7' cannot be respectively connected and made to function also as common electrode lines.

The inventors propose a structure in which the common electrode lines 25' are disposed at the electromagnetic wave irradiation surface downstream side of the semiconductor layer 6'.

As an example, FIG. 14 is a plan view showing the structure of one pixel unit of the electromagnetic wave detecting element 10' at which the common electrode line 25' is disposed at the electromagnetic wave irradiation surface downstream side of the semiconductor layer 6'. Further, a cross-sectional view along line A-A of FIG. 14 is shown in FIG. 15A, and a cross-sectional view along line B-B of FIG. 14 is shown in FIG. 15B.

In this structure, a deterioration in the light utilization efficiency due to the common electrode lines 25' does not arise. However, in this structure, in order to apply bias voltage to the upper electrodes 7' of the sensor portions 103', contact portions 22' are provided respectively at the sensor portions 103' and electrically connect the common electrode lines 25' and the upper electrodes 7' of the respective sensor portions 103'. In particular, in this structure, as compared with conventional structures, the semiconductor layer 6' cannot be disposed in vicinities of the contact portions 22', and therefore, the light utilization efficiency decreases greatly.

Note that, in the above description, the efficiency of utilization of light is mentioned because light is the object of detection of the semiconductor layer 6'. However, the same holds as well in cases in which the object of detection is any type of electromagnetic waves such as ultraviolet rays or infrared rays.

SUMMARY OF THE INVENTION

The present invention provides an electromagnetic wave detecting element that can suppress a decrease in the efficiency of utilizing electromagnetic waves at sensor portions.

A first aspect of the present invention is an electromagnetic wave detecting element including: a plurality of sensor portions, including: a semiconductor layer provided in correspondence with respective intersection portions of a plurality of scan lines and a plurality of signal lines that are disposed to intersect one another, the semiconductor layer generating charges due to irradiated electromagnetic waves, that express an image that is an object of detection, first electrodes formed by electrically-conductive members, that have transmittance with respect to the electromagnetic waves, at irradiation surface sides of the semiconductor layer to which the electromagnetic waves are irradiated, the first electrodes applying bias voltage to the semiconductor layer, second electrodes formed at non-irradiation surface sides of the semiconductor layer with respect to the electromagnetic waves, the second electrodes collecting the charges that are generated at the semiconductor layer, wherein one of the first electrodes is electrically connected to any other adjacent first electrode to form a group of sensor portions; a common electrode line, provided via the plurality of sensor portions and an insulating film, for supplying the bias voltage; and a plurality of contacts provided at the insulating film respectively per group of sensor portions whose first electrodes are electrically connected, and at each of the groups of sensor portions, the contact connects the common electrode line and the first electrode of any sensor portion belonging to that group of sensor portions, via a contact hole formed in the insulating film and at a connection place of a number that is less than a number of sensor portions belonging to that group of sensor portions.

The first aspect of the present invention includes: the semiconductor layer that generate charges due to electromagnetic waves, that express an image that is an object of detection, being irradiated; the first electrodes formed by electrically-conductive members, that have transmittance with respect to the electromagnetic waves, at irradiation surface sides of the semiconductor layer at which the electromagnetic waves are irradiated, the first electrodes applying bias voltage to the semiconductor layer; and the second electrodes formed at non-irradiation surface sides of the semiconductor layer with respect to the electromagnetic waves, and collecting the charges that are generated at the semiconductor layer. Further, the plural sensor portions, that are provided with these, are provided in correspondence with the respective intersecting portions of the plural scan lines and the plural signal lines that are disposed so as to intersect one another. Moreover, the first electrode is electrically connected to any other adjacent first electrode.

In the first aspect, the common electrode line that is for supplying bias voltage is provided via the plural sensor portions and the insulating film. Further, at each group of sensor portions whose first electrodes are electrically connected, the common electrode line and the first electrode of any sensor portion belonging to that group of sensor portions are connected by a contact via a contact hole formed in the insulating film and at a connection place of a number that is less than the number of sensor portions belonging to that group of sensor portions.

In this way, in the first aspect of the present invention, the first electrode of each of the respective sensor portions, that are provided in correspondence with the respective intersection portions of the plural scan lines and the plural signal lines that are disposed so as to intersect one another, is electrically connected to any other adjacent first electrode. In addition, at each group of sensor portions whose first electrodes are electrically connected, the common electrode line and the first electrode of any sensor portion belonging to that group of sensor portions, are connected by a contact via a contact hole formed in the insulating film and at a connection place of a number that is less than the number of sensor portions belonging to that group of sensor portions. Accordingly, there is no need to provide contacts at all of the sensor portions. Therefore, a decrease in the efficiency of utilizing electromagnetic waves at the sensor portions can be suppressed.

In a second aspect of the present invention, in the above-described aspect, the common electrode line is provided, via the plural sensor portions and the insulating film, at an electromagnetic wave upstream side of the sensor portions, and the plural contacts connecting the first electrodes and the common electrode line via contact holes formed in the insulating film from the electromagnetic wave upstream side.

In a third aspect of the present invention, in the above-described aspect, the common electrode line is provided, via the plural sensor portions and the insulating film, at an electromagnetic wave downstream side of the sensor portions, the plural contacts connecting the first electrodes and the common electrode line via contact holes formed in the insulating film and the sensor portions from the electromagnetic wave downstream side, and the sensor portions are formed to separate the semiconductor layer and the second electrodes from the contact holes by a predetermined distance.

In a fourth aspect of the present invention, in the above-described aspect, at the plural sensor portions, the first electrodes are electrically connected along either a scan line direction or a signal line direction, and the plural contacts are provided at an interval of a predetermined number of sensor portions with respect to the one direction, and positions of placement of the plural contacts are offset in the selected direction each one line or each plural lines with respect to the other direction of the scan line direction or the signal line direction.

In a fifth aspect of the present invention, in the above-described aspect, the plural contacts are provided in a ratio of one contact with respect to two sensor portions.

In a sixth aspect of the present invention, in the above-described aspect, at the plural sensor portions, two semiconductor layers are formed to be substantially line-symmetrical with respect to a boundary line bounding between two sensor portions.

In a seventh aspect of the present invention, in the above-described aspect, plural common electrode lines are disposed along a signal line direction, and the plural sensor portions are disposed to electrically connect the first electrodes along the signal line direction, and connection regions that electrically connect the first electrodes do not intersect the signal lines.

In an eighth aspect of the present invention, in the above-described aspect, the plural contacts are provided at connection regions that electrically connect the first electrodes.

In a ninth aspect of the present invention, in the above-described aspect, the plural sensor portions and the plural contacts are disposed in a pattern in which an array of sensor portions, that is greater than or equal to 2×2 sensor portions in a scan line direction and in a signal line direction, is repeated.

In a tenth aspect of the present invention, in the above-described aspect, the common electrode line has a lower resistance than the electrically-conductive members that form the first electrodes.

In an eleventh aspect of the present invention, in the above-described aspect, the electrically-conductive members are Al or Cu, or are an alloy or a layered film formed including Al or Cu.

Further, in a twelfth aspect of the present invention, in the above-described aspect, the scan lines are formed from a wiring layer that is formed, via the insulating film, at an electromagnetic wave downstream side of a wiring layer at which the common electrode line is formed, and the contact holes are formed at positions that are at the irradiation surface sides of regions where the scan lines are formed.

Here, the electromagnetic waves mean electromagnetic waves that are mainly detected at the sensor portions. For example, in the case of an electromagnetic wave detecting element that is used in an indirect-conversion-type radiation image detection device, the light that is emitted by the scintillator corresponds to the electromagnetic waves. Accordingly, the sides of the semiconductor layer that face the scintillator are the electromagnetic wave irradiation surfaces and the sides opposite the scintillator are the electromagnetic wave non-irradiation surfaces. On the other hand, for the other wiring layers and the like, the scintillator side thereof is called the upstream side, and the opposite side thereof is called the downstream side.

In this way, in accordance with the present invention, a decrease in the efficiency of utilizing electromagnetic waves at sensor portions can be suppressed.

BRIEF DESCRIPTION OF THE DRAWINGS

Exemplary embodiments of the present invention will be described in detail based on the following figures, wherein:

FIG. 5A through FIG. 5J are drawings for explaining processes of fabricating the electromagnetic wave detecting element relating to the first exemplary embodiment;

FIG. 7A and FIG. 7B are cross-sectional views of the electromagnetic wave detecting element relating to the second exemplary embodiment;

DETAILED DESCRIPTION OF THE INVENTION

Exemplary embodiments of the present invention will be described hereinafter with reference to the drawings. Note that, hereinafter, cases will be described in which the present invention is applied to a radiation image detection device 100.

First Exemplary Embodiment

Figure 1:
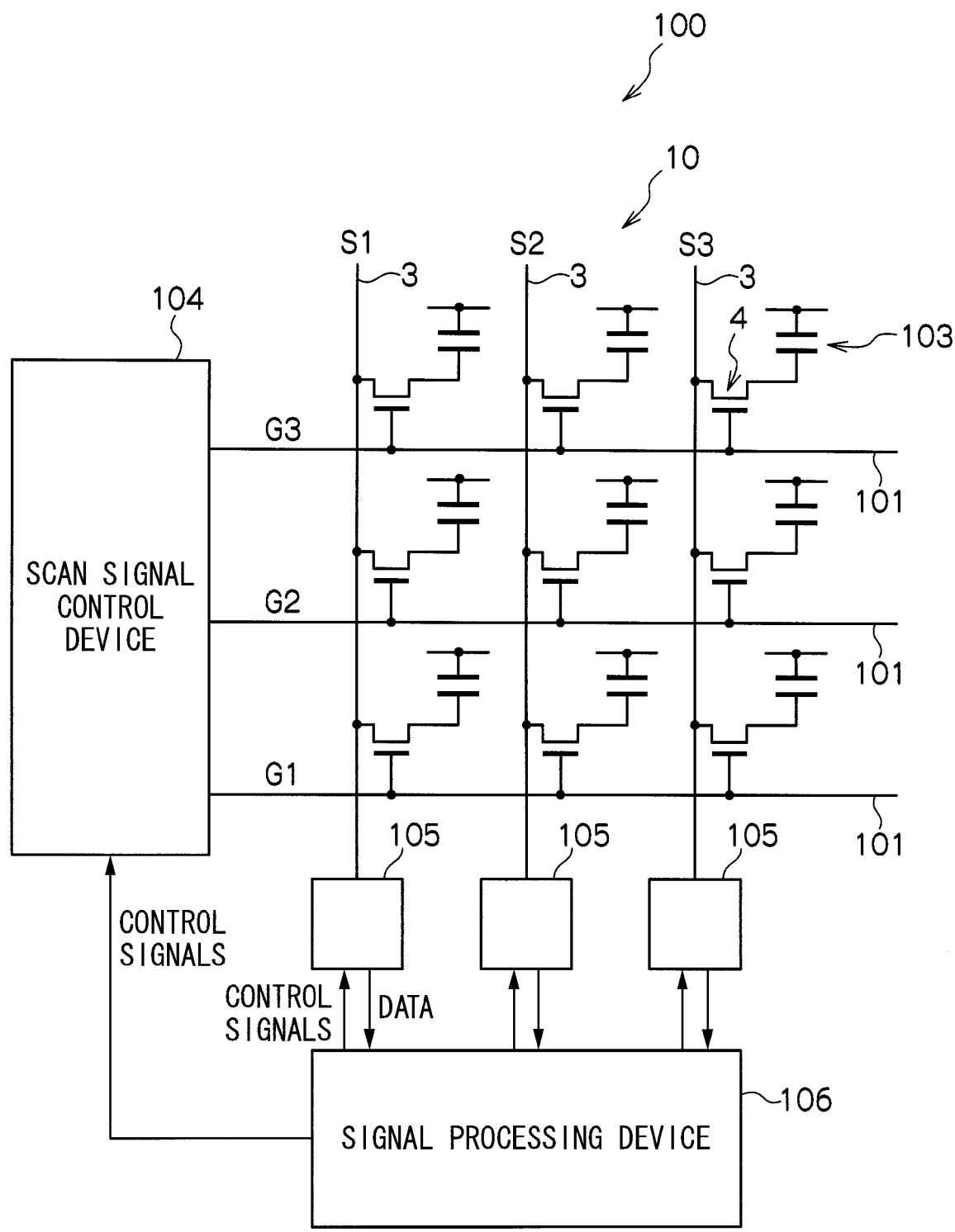
FIG. 1 is a structural drawing showing the overall structure of a radiation image detection device relating to first and second exemplary embodiments.

The overall structure of the radiation image detection device 100 relating to a first exemplary embodiment is illustrated in FIG. 1. However, a scintillator that converts radiation into light is not illustrated.

As shown in FIG. 1, the radiation image detection device 100 relating to the present exemplary embodiment has an electromagnetic wave detecting element 10.

The electromagnetic wave detecting element 10 has upper electrodes, semiconductor layer, and lower electrodes that will be described later. Further, numerous pixels that are structured to include sensor portions 103 and TFT switches 4 are provided in a two-dimensional form at the electromagnetic wave detecting element 10. The sensor portion 103 receives light, that is obtained by irradiated radiation being converted at a scintillator, and accumulates charges. The TFT switch 4 is provided in order to read-out the charges accumulated in the sensor portion 103.

Plural scan lines 101 and plural signal lines 3 are provided at the electromagnetic wave detecting element 10 so as to intersect one another. The scan lines 101 turn the TFT switches 4 on and off. The signal lines 3 read-out the charges accumulated in the sensor portions 103.

Due to any of the TFT switches 4 that are connected to the signal line 3 being turned on, an electric signal corresponding to the charge amount accumulated in the sensor portion 103 flows to the signal line 3. Signal detecting circuits 105, that detect the electric signals that flow-out to the signal lines 3, are connected to the respective signal lines 3. Further, a scan signal controlling device 104, that outputs control signals for turning the TFT switches 4 on and off to the scan lines 101, is connected to the respective scan lines 101.

The signal detecting circuits 105 incorporate therein, for each of the signal lines 3, an amplifying circuit that amplifies the inputted electric signal. At the signal detecting circuits 105, the electric signals that are inputted from the respective signal lines 3 are amplified by the amplifying circuits and detected. The signal detecting circuits 105 thereby detects the charge amounts accumulated in the respective sensor portions 103 as information of the respective pixels structuring the image.

A signal processing device 106 is connected to the signal detecting circuits 105 and the scan signal controlling device 104. The signal processing device 106 carries out predetermined processings on the electric signals detected at the signal detecting circuits 105, and outputs control signals expressing signal detecting timings to the signal detecting circuits 105, and outputs control signals expressing scan signal outputting timings to the scan signal controlling device 104.

Figure 2:
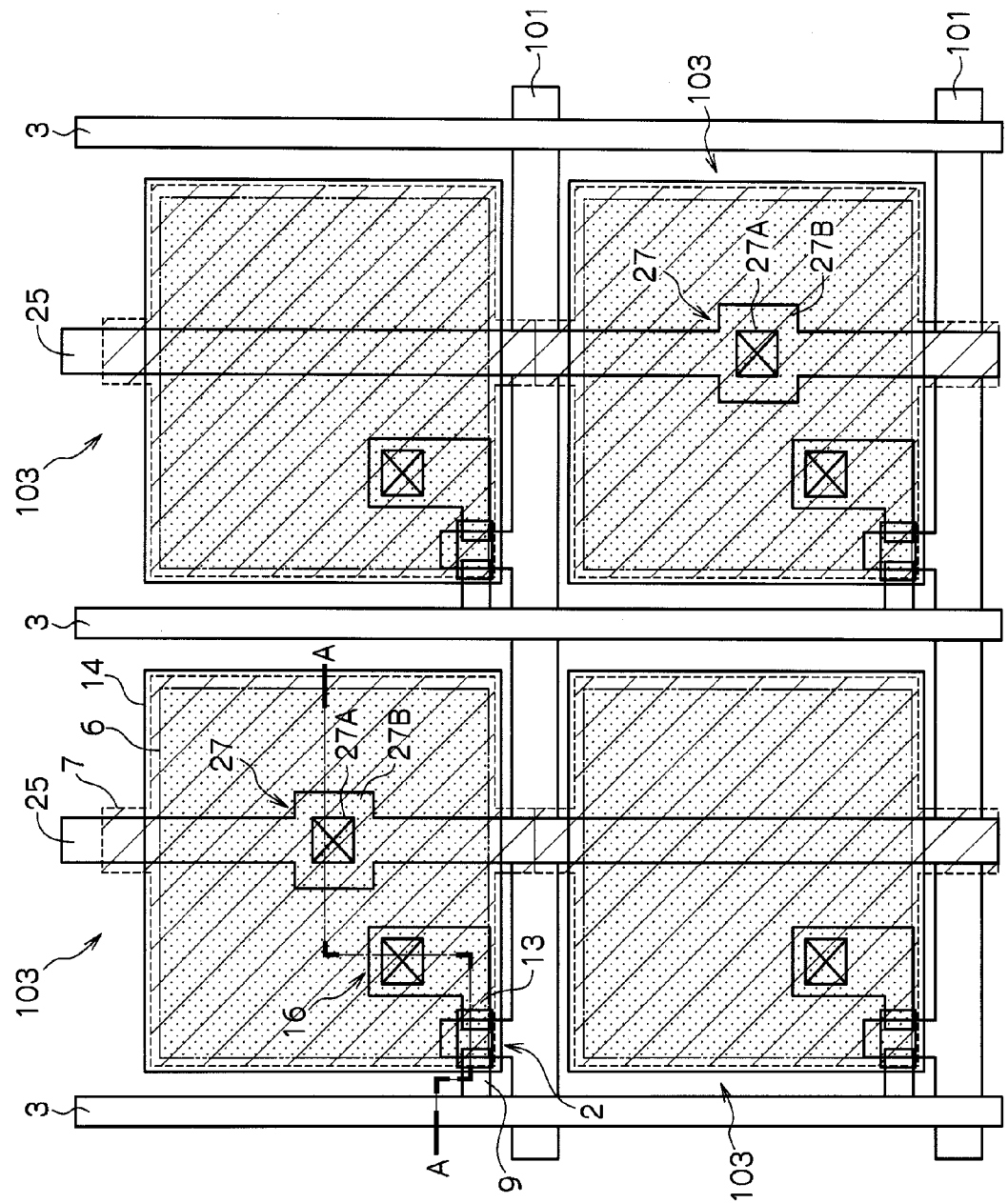
FIG. 2 is a plan view showing the structure of four pixel units of an electromagnetic wave detecting element relating to the first exemplary embodiment.

Next, the electromagnetic wave detecting element 10 relating to the present exemplary embodiment will be described in further detail with reference to FIG. 2 and FIG. 3. Note that a plan view showing the structure of four pixel units of the electromagnetic wave detecting element 10 relating to the present exemplary embodiment is shown in FIG. 2. Further, a cross-sectional view along line A-A of FIG. 2 is shown in FIG. 3.

Figure 3:
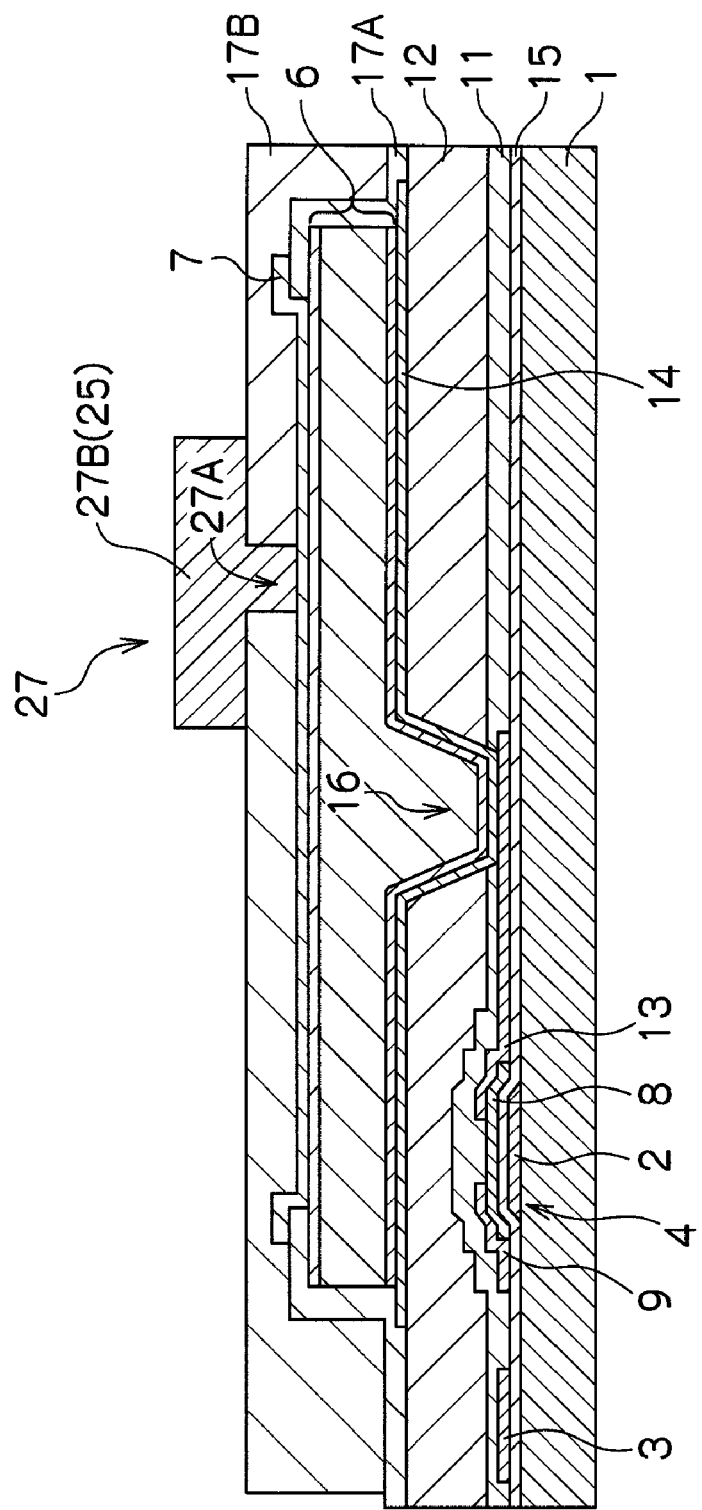
FIG. 3 is a cross-sectional view of the electromagnetic wave detecting element relating to the first exemplary embodiment.

As shown in FIG. 3, at the electromagnetic wave detecting element 10, the scan lines 101 and gate electrodes 2 are formed on an insulative substrate 1 that is formed from alkaline-free glass or the like. Further, the scan lines 101 and the gate electrodes 2 are connected (see FIG. 2). The wiring layer at which the scan lines 101 and the gate electrodes 2 are formed (hereinafter, this wiring layer is also called a "first signal wiring layer") is formed by using Al or Cu, or a layered film formed including Al or Cu. However, the formation of the wiring layer is not limited to these.

An insulating film 15 is formed on the entire surface on the scan lines 101 and the gate electrodes 2, so as to cover the scan lines 101 and the gate electrodes 2. The region of the insulating film 15 that is positioned above the gate electrode 2 works as a gate insulating film at the TFT switch 4. The insulating film 15 is formed of, for example, $SiN_x$ or the like, and by, for example, CVD (Chemical Vapor Deposition).

Semiconductor active layers 8 are formed as islands above the gate electrodes 2 on the insulating film 15. The semiconductor active layer 8 is the channel portion of the TFT switch 4, and is formed from, for example, an amorphous silicon film.

A source electrode 9 and a drain electrode 13 are formed at the upper layer thereof. Together with the source electrodes 9 and the drain electrodes 13, the signal lines 3 are formed at the wiring layer at which the source electrodes 9 and the drain electrodes 13 are formed. The source electrodes 9 are connected to the signal lines 3 (see FIG. 2). The wiring layer in which the signal lines 3 and the source electrodes 9 are formed (hereinafter, this wiring layer is also called a "second signal wiring layer") is formed by using Al or Cu, or a layered film formed including Al or Cu. However, the formation of the wiring layer is not limited to these.

A contact layer (not shown) is formed between, on the one hand, the source electrode 9 and the drain electrode 13, and, on the other hand, the semiconductor active layer 8. This contact layer is formed from an impurity-added semiconductor such as an impurity-added amorphous silicon or the like. The TFT switch 4 for switching is structured by these.

A TFT protecting film layer 11 is formed on substantially the entire surface of the region on the substrate 1 where the pixels are provided (substantially the entire region), so as to cover the semiconductor active layers 8, the source electrodes 9, the drain electrodes 13, and the signal lines 3. The TFT protecting film layer 11 is formed of, for example, $SiN_x$ or the like, and by, for example, CVD.

A coating-type interlayer insulating film 12 is formed on the TFT protecting film layer 11. The interlayer insulating film 12 is formed to a film thickness of 1 to 4 μm from a photosensitive organic material (e.g., a positive photosensitive acrylic resin: a material in which a naphthoquinonediazide positive photosensitive agent is mixed together with a base polymer formed from a copolymer of methacrylic acid and glycidyl methacrylate, or the like) having a low permittivity (dielectric constant $\epsilon_r$=2 to 4). In the electromagnetic wave detecting element 10 relating to the present exemplary embodiment, the capacity between the metals that are disposed at the upper layer and the lower layer of the interlayer insulating film 12 is kept low by the interlayer insulating film 12. Further, generally, such a material also functions as a flattening film, and also has the effect of flattening the steps of the lower layer. The shapes of semiconductor layer 6 that are disposed at the upper layer are flattened thereby. Therefore, a decrease in the absorption efficiency due to unevenness of the semiconductor layer 6, and an increase in leak current can be suppressed. Contact holes 16 are formed in the interlayer insulating film 12 and the TFT protecting film layer 11 at positions opposing the drain electrodes 13.

A lower electrode 14 of the sensor portion 103 is formed on the interlayer insulating film 12, so as to cover the pixel region while filling-in the contact hole 16. The lower electrode 14 is connected to the drain electrode 13 of the TFT switch 4. If the semiconductor layer 6 that will be described later is thick and around 1 μm, there are hardly any limitations on the material of the lower electrode 14 provided that it is electrically-conductive. Therefore, the lower electrode 14 can be formed by using an electrically-conductive metal such as an Al-type material, ITO (indium tin oxide), or the like.

On the other hand, if the film thickness of the semiconductor layer 6 is thin (around 0.2 to 0.5 μm), the absorption of light at the semiconductor layer 6 is insufficient. In order to prevent an increase in leak current due to the illumination of light onto the TFT switch 4, it is preferable to make the lower electrode 14 be an alloy or a layered film that is formed including a light-shielding metal.

The semiconductor layer 6 that functions as a photodiode is formed on the lower electrode 14. In the present exemplary embodiment, a PIN structure photodiode is employed as the semiconductor layer 6. The semiconductor layer 6 of the present exemplary embodiment is formed by layering an $n^+$ layer, an i layer, and a $p^+$ layer in that order from the lower layer. Note that, in the present exemplary embodiment, the lower electrode 14 is made to be larger than the semiconductor layer 6. Note that, if the film thickness of the semiconductor layer 6 is thin (e.g., less than or equal to 0.5 μm), in order to prevent incidence of light onto the TFT switch 4, it is preferable to place a light-shielding metal at the lower electrode 14 and cover the TFT switch 4.

Further, in the present exemplary embodiment, in order to suppress the advancing of light into the TFT switch 4 due to irregular reflection of light at the device interior, the interval from the channel portion of the TFT switch 4 to the end portion of the lower electrode 14 that is formed from a light-shielding metal is ensured to be greater than or equal to 5 μm.

A first protective insulating film 17A is formed on the interlayer insulating film 12 and the semiconductor layer 6, so as to have openings at the respective semiconductor layer 6 portions. In the same way as the TFT protecting film layer 11, the first protective insulating film 17A is formed of, for example, $SiN_x$ or the like, and by, for example, CVD.

An upper electrode 7 is formed on the semiconductor layer 6 and the first protective insulating film 17A, so as to cover at least the opening portion of the first protective insulating film 17A. A material having high light transmittance such as, for example, ITO or IZO (indium zinc oxide) or the like, is used as the upper electrode 7.

A second protective insulating film 17B is disposed at the upper layer of the upper electrode 7 and the first protective insulating film 17A. In the same way as the first protective insulating film 17A, the second protective insulating film 17B is formed of, for example, $SiN_x$ or the like, and by, for example, CVD.

A common electrode line 25, that is Al or Cu, or is an alloy or a layered film formed including Al or Cu, is formed on the second protective insulating film 17B.

Further, a contact portion 27 is provided at the second protective insulating film 17B in order to connect the common electrode line 25 and the upper electrode 7.

A contact hole 27A, that is formed in the second protective insulating film 17B, is provided at the center of the contact portion 27. Further, a contact pad 27B is provided at the contact portion 27 so as to cover the contact hole 27A. In the present exemplary embodiment, in order to keep the resistance value between the common electrode line 25 and the upper electrode 7 small, and for the fabricating yield of the photolithographic process at the time of fabricating the electromagnetic wave detecting element 10, the size of the contact hole 27A is made to be 8×8 µm, and the size of the contact pad 27B that electrically connects the common electrode line 25 and the upper electrode 7 is made to be 15×15 µm (the alignment margin is ±3.5 µm).

The common electrode line 25 is electrically connected to the upper electrode 7 via the contact portion 27 provided at the second protective insulating film 17B.

Further, as shown in FIG. 2, at the electromagnetic wave detecting element 10 relating to the present exemplary embodiment, portions of the upper electrodes 7 of two sensor portions 103 at a time along the signal line direction are respectively extended, such that the upper electrodes 7 are electrically connected to one another. Further, in the electromagnetic wave detecting element 10 relating to the present exemplary embodiment, the contact portion 27 is provided in a ratio of one per each group of sensor portions 103 whose upper electrodes 7 are electrically connected (in the present exemplary embodiment, two sensor portions 103). Moreover, in the electromagnetic wave detecting element 10 relating to the present exemplary embodiment, the contact portions 27 are disposed in a checkered pattern such that the position at which the contact portion 27 is disposed per line with respect to the scan line direction is offset by one sensor portion 103 at a time in the signal line direction.

Accordingly, in the electromagnetic wave detecting element 10 relating to the present exemplary embodiment, the number of contact portions 27 is one-half of the number of sensor portions 103.

Figure 4:
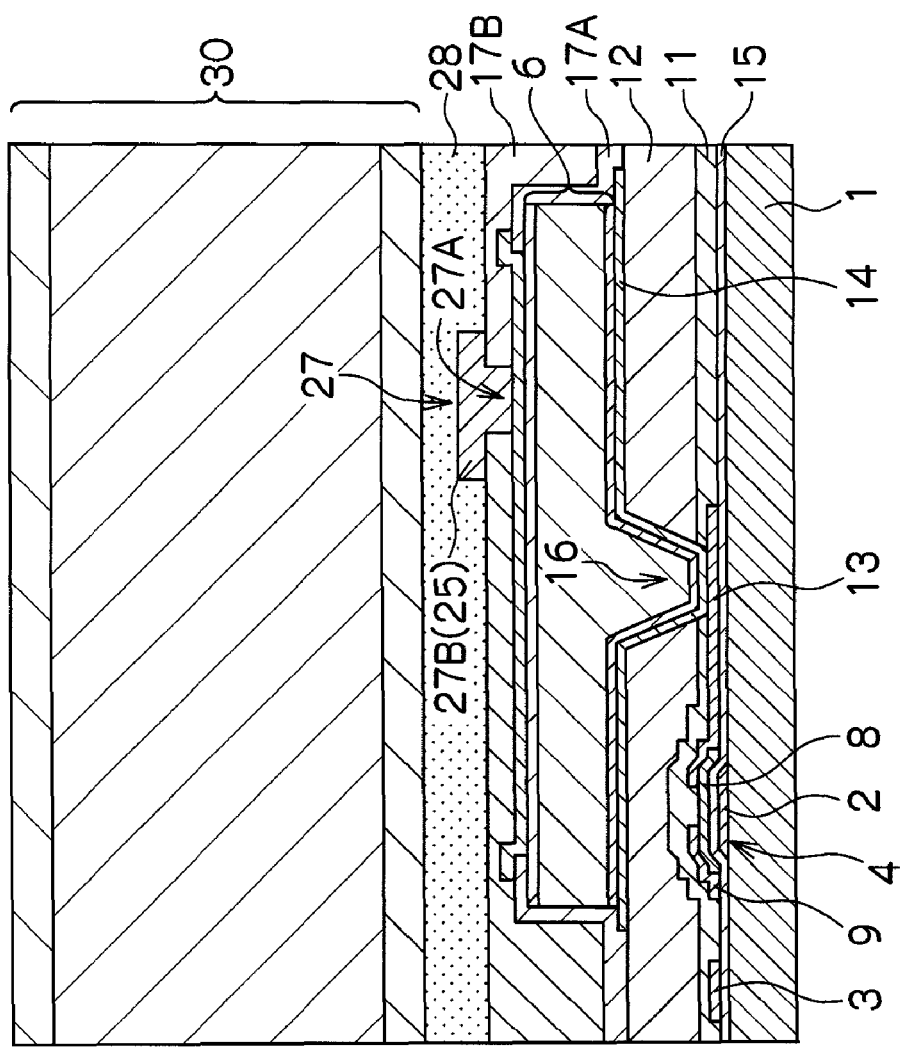
FIG. 4 is a cross-sectional view of the electromagnetic wave detecting element to which a scintillator is affixed, relating to the first exemplary embodiment.

As shown in FIG. 4, a scintillator 30 formed of GOS or the like is affixed to the electromagnetic wave detecting element 10 that is formed in this way, by using an adhesive resin 28 having low light absorbance, or the like.

Next, an example of the processes of fabricating the electromagnetic wave detecting element 10 relating to the first exemplary embodiment will be described with reference to FIG. 5A through FIG. 5J.

First, the gate electrodes 2 and the scan lines 101 are formed on the substrate 1 as the first signal wiring layer (FIG. 5A). This first signal wiring layer is formed from a low-resistance metal such as Al, an Al alloy or the like, or from a layered film that is layered with a barrier metal layer formed from a high melting point metal. The first signal wiring layer is deposited on the substrate 1 by sputtering to a film thickness of around 100 to 300 nm. Thereafter, patterning of a resist film is carried out by a photolithographic technique. Thereafter, the metal film is patterned by wet etching using an etchant for Al or by dry etching. By removing the resist thereafter, the first signal wiring layer is completed.

Next, the insulating film 15, the semiconductor active layers 8, and the contact layers (not shown) are successively deposited on the first signal wiring layer (FIG. 5B). The insulating film 15 is formed from SiNx. The film thickness of the insulating film 15 is 200 to 600 nm. Further, the semiconductor active layers 8 are formed from amorphous silicon, and the film thickness thereof is around 20 to 200 nm. Moreover, the contact layers are formed from an impurity-added amorphous silicon, and have a film thickness of around 10 to 100 nm, and are deposited by P-CVD (Plasma-Chemical Vapor Deposition). Thereafter, in the same way as the first signal wiring layer, patterning of the resist is carried out by a photolithographic technique. Thereafter, the semiconductor active regions are formed by selectively dry etching, with respect to the insulating film 15, the semiconductor active layers 8 and the contact layers that are formed by an impurity-added semiconductor.

Next, the signal lines 3, the source electrodes 9, and the drain electrodes 13 are formed as the second signal wiring layer at the top layer of the insulating film 15 and the semiconductor active layers 8 (FIG. 5C). In the same way as the first signal wiring layer, the second signal wiring layer is formed from a low-resistance metal such as Al, an Al alloy or the like, or from a layered film that is layered with a barrier metal layer formed from a high melting point metal, or from a single layer of a high melting point metal film such as Mo or the like. The film thickness of the second signal wiring layer is around 100 to 300 nm. In the same way as the first signal wiring layer, the second signal wiring layer is formed by patterning being carried out by a photolithographic technique, and the metal film being patterned by wet etching using an etchant for Al or by dry etching. By selectively employing the etching method at this time, the insulating film 15 is not removed. Next, by dry etching, portions of the contact layers and the semiconductor active layers 8 are removed and channel regions are formed.

Next, the TFT protecting film layer 11 and the interlayer insulating film 12 are successively formed at the upper layer of the layers that were formed as described above (FIG. 5D). The TFT protecting film layer 11 and the interlayer insulating film 12 are formed by a single body of an inorganic material, or are formed by layering a protective insulating film formed of an inorganic material and an interlayer insulating film formed of an organic material, or are formed by a single layer of an interlayer insulating film that is organic. In the present exemplary embodiment, there is a layered structure of the interlayer insulating film 12 that is photosensitive and the TFT protecting film layer 11 that is formed of an inorganic material, in order to stabilize the characteristics of the TFT switch 4 and suppress the electrostatic capacity between the lower electrode 14 and the common electrode line 25 at the lower layer. Therefore, in the present exemplary embodiment, for example, the TFT protecting film layer 11 is formed by CVD, and the interlayer insulating film 12 material that is photosensitive and is a coating material is coated, pre-baked, subjected to exposure, developed, and baked, in order to form the respective layers.

Next, the TFT protecting film layer 11 is patterned by a photolithographic technique (FIG. 5E). Note that this step is not necessary in cases in which the TFT protecting film layer 11 is not provided.

Next, an Al-type material or a metal material such as ITO or the like is deposited by sputtering to a film thickness of around 20 to 200 nm on the top layer of the above-described layers. Then, patterning is carried out by a photolithographic technique, and patterning is carried out by wet etching using an etchant for metal or the like or by dry etching, so as to form the lower electrodes 14 (FIG. 5F).

Next, respective layers of $n^+$, i, $p^+$ are deposited in order from the lower layer by using CVD, so as to form the semiconductor layer 6 (see FIG. 5G). The film thickness of the $n^+$ layer is 50 to 500 nm, the film thickness of the i layer is 0.2 to 2 μm, and the film thickness of the $p^+$ layer is 50 to 500 nm. The respective layers of the semiconductor layer 6 are layered in order, and the semiconductor layer 6 is patterned by a photolithographic technique. Next, by selectively etching the interlayer insulating film 12 at the lower layer by dry etching or by wet etching, the semiconductor layer 6 are completed.

Here, in the present exemplary embodiment, the semiconductor layer 6 is formed by layering $n^+$, i, $p^+$ in that order. However, the semiconductor layer 6 may be made to be a PIN diode by layering $p^+$, i, $n^+$ in that order.

Next, the first protective insulating film 17A that is formed from an SiNx film is deposited by CVD or the like so as to cover the semiconductor layer 6. The film thickness of the first protective insulating film 17A is around 100 to 300 nm. Thereafter, the first protective insulating film 17A is patterned by a photolithographic technique and dry etching, and opening portions are formed (FIG. 5H). Here, the depositing of SiNx by using CVD is given as an example. However, the first protective insulating film 17A is not limited to SiNx, and another material may be applied provided that it is an insulating material.

Next, the upper electrodes 7 are formed (FIG. 5I). The upper electrodes 7 are deposited to a film thickness of around 20 to 200 nm by sputtering a transparent electrode material such as ITO or the like at the top layer of the layers that are formed as described above. The upper electrodes 7 are patterned by a photolithographic technique, and by wet etching using an etchant for ITO or the like or by dry etching.

Next, the second protective insulating film 17B, the common electrode lines 25, and the contact portions 27 are formed (FIG. 5J). In the same way as the first protective insulating film 17A, the second protective insulating film 17B that is formed from an SiNx film is deposited to a film thickness of around 200 to 500 nm so as to cover the upper electrodes 7 and the first protective insulating film 17A. Thereafter, the contact holes 27A are formed by patterning by a photolithographic technique and dry etching. Here, the depositing of SiNx by using CVD is given as an example. However, the second protective insulating film 17B is not limited to SiNx, and another material may be applied provided that it is an insulating material. The common electrode lines 25 and the contact pads 27B are formed by depositing a metal material such as Al or Cu, an alloy formed including Al or Cu, or the like by sputtering at the top layer of the layers that are formed as described above. The film thickness of the common electrode lines 25 and the contact pads 27B is around 100 to 500 nm. Next, the common electrode lines 25 and the contact pads 27B are formed by patterning by a photolithographic technique, and by wet etching using an etchant for metal or the like or by dry etching.

Finally, the scintillator 30 formed of GOS is affixed, by using the adhesive resin 28 or the like, to the electromagnetic wave detecting element 10 that is formed in this way. The electromagnetic wave detecting element 10 shown in FIG. 4 is thereby formed.

Principles of the operation of the radiation image detection device 100 of the above-described structure will be described next.

When X-rays are irradiated from above in FIG. 4, the irradiated X-rays are absorbed by the scintillator 30 and are converted into visible light. The X-rays may be irradiated from below in FIG. 4. In this case as well, the X-rays are absorbed by the scintillator 30 and are converted into visible light. The light amount generated from the scintillator 30 is 0.5 to 2 $\mu W/cm^2$ in usual X-ray photography for medical diagnosis. This generated light passes through the layer of the adhesive resin 28, and is illuminated onto the semiconductor layer 6 of the sensor portions 103 that are arranged in the form of an array on the TFT array substrate.

At the electromagnetic wave detecting element 10, the semiconductor layer 6 is provided so as to be separated into the respective pixel units. A predetermined bias voltage is applied to the semiconductor layer 6 from the upper electrode 7 via the common electrode line 25. When light is illuminated, charges are generated at the interior of the semiconductor layer 6. For example, in the case of the semiconductor layer 6 having a PIN structure that is layered in the order of an $n^+$ layer, an i layer, and a $p^+$ layer ($n^+$ amorphous silicon, amorphous silicon, $p^+$ amorphous silicon) from the lower layer, negative bias voltage is applied to the upper electrode 7. If the film thickness of the i layer is around 1 μm, the bias voltage that is applied is around −5 to −10 V. When light is not illuminated, only current that is less than or equal to several $pA/mm^2$ flows at the semiconductor layer 6. On the other hand, when light is illuminated (1 $\mu W/cm^2$), the semiconductor layer 6 generates light current of around several to several ten $nA/mm^2$. The generated charges are collected by the lower electrode 14. The lower electrode 14 is connected to the drain electrode 13 of the TFT switch 4. The source electrode 9 of the TFT switch 4 is connected to the signal line 3. At the time of image detection, negative bias is applied to the gate electrode 2 of the TFT switch 4 and the TFT switch 4 is maintained in an off state, and the charges collected by the lower electrode 14 are accumulated.

At the time of reading-out the image, on signals (+10 to 20 V) are successively applied to the gate electrodes 2 of the TFT switches 4 via the scan lines 101. Due to the TFT switches 4 being successively turned on, electric signals corresponding to the charge amounts accumulated in the lower electrodes 14 flow-out to the signal lines 3. On the basis of the electric signals that flow-out to the signal lines 3, the signal detecting circuits 105 detect the charge amounts accumulated in the respective sensor portions 103 as information of the respective pixels structuring the image. The image information expressing the image, that is expressed by the X-rays that are irradiated onto the electromagnetic wave detecting element 10, can thereby be obtained.

At the electromagnetic wave detecting element 10 relating to the present exemplary embodiment, only one contact portion 27 is provided per two sensor portions 103 whose upper electrodes 7 are connected. Accordingly, as shown in FIG. 2, only two of the contact portions 27 are disposed with respect to four of the sensor portions 103. Due thereto, the average surface area at which the light, that has been converted into visible light by the scintillator 30 and is illuminated onto the semiconductor layer 6, is cut-off by the contact pads 27B is reduced. Therefore, in the electromagnetic wave detecting element 10 relating to the present exemplary embodiment, a decrease in the efficiency of utilizing the light that is illuminated can be suppressed.

Here, for example, in a case in which the size of the contact hole 27A is 8×8 μm, the size of the contact pad 27B is 15×15

µm, the width of the common electrode line 25 is 4 µm, and the size of the semiconductor layer 6 is 50×50 µm, the surface area at which light is cut-off by the common electrode line 25 and the contact pad 27B is 365 µm² (=4×(50−15)+15×15 µm).

Thereamong, the amount of loss of the effective region due to the contact pad 27B is 165 µm² (=(15−4)×15 µm).

Accordingly, in a case in which the contact portion 27 is provided on the semiconductor layer 6 of each sensor portion 103 and bias voltage is applied to the upper electrode 7 of each sensor portion 103 from the common electrode lines 25, the surface area of the effective region of each sensor portion 103 decreases 6.6% (=165/(50×50)).

On the other hand, in the electromagnetic wave detecting element 10 relating to the present exemplary embodiment, the number of the contact portions 27 is thinned such that the contact portion 27 is provided per two of the sensor portions 103. Therefore, the surface area of the effective region of each sensor portion 103 decreases only 3.3% on average. The sensor sensitivity of the sensor portion 103 is proportional to the surface area of the effective region of the sensor portion 103. Thus, in the electromagnetic wave detecting element 10 relating to the present exemplary embodiment, the sensor sensitivity improves.

Further, contact portions 27 are arranged in the form of a checkered pattern in the electromagnetic wave detecting element 10 relating to the present exemplary embodiment. Therefore, in the image information that is obtained by X-rays being irradiated onto the electromagnetic wave detecting element 10, a deterioration in image quality can be made to be difficult to perceive.

Second Exemplary Embodiment

A second exemplary embodiment, that is structured such that the common electrode lines 25 are disposed at the electromagnetic wave irradiation surface downstream side of the semiconductor layer 6, will be described next.

Figure 6:
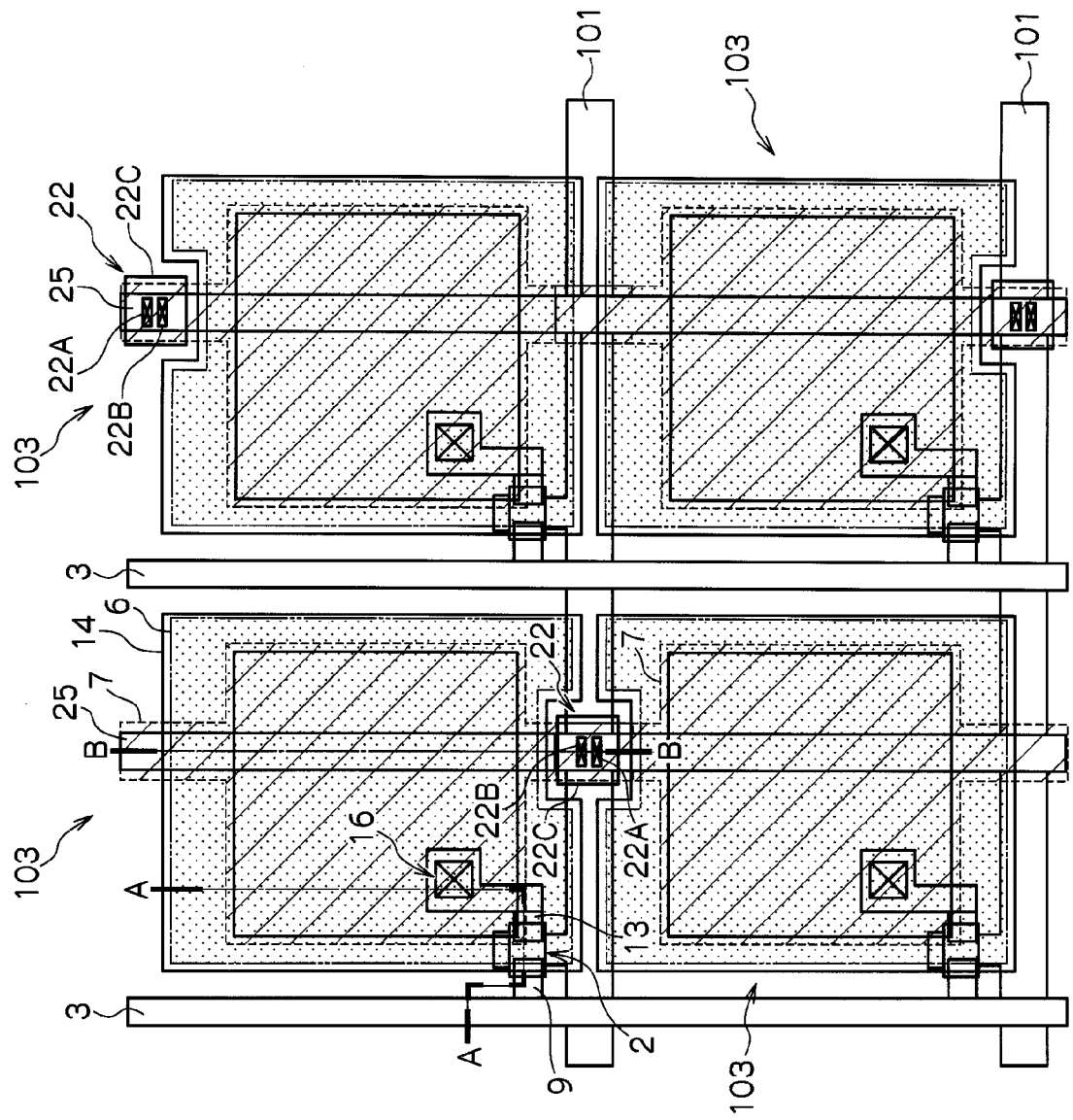
FIG. 6 is a plan view showing the structure of four pixel units of an electromagnetic wave detecting element relating to the second exemplary embodiment.

A plan view showing the structure of four pixel units of the electromagnetic wave detecting element 10 relating to the second exemplary embodiment is shown in FIG. 6. A cross-sectional view along line A-A of FIG. 6 is shown in FIG. 7A. Further, a cross-sectional view along line B-B of FIG. 6 is shown in FIG. 7B. Note that explanation of portions in FIG. 6 and FIG. 7 that are the same as in FIG. 2 and FIG. 3 will be omitted.

In the present exemplary embodiment, the common electrode lines 25 are, in the same way as the signal lines 3, formed by the second signal wiring layer, and are formed parallel to the signal lines 3. Note that the common electrode lines 25 may be formed by a metal wiring layer that is provided separately from the second signal wiring layer.

The upper electrode 7 is formed on the semiconductor layer 6 and the first protective insulating film 17A, so as to cover at least the opening portion of the first protective insulating film 17A. A material having high light transmittance such as, for example, ITO or IZO (indium zinc oxide) or the like, is used as the upper electrode 7. The upper electrode 7 also functions as an electrically-conductive member for supplying bias voltage to that upper electrode 7 from the common electrode line 25 that is disposed at the lower layer thereof.

As shown in FIG. 7B, contact portions 22 for connecting the common electrode lines 25 and the upper electrodes 7 are provided in the first protective insulating film 17A.

A contact hole 22A, that is formed in the TFT protecting film layer 11 and the interlayer insulating film 12, and a contact hole 22B, that is formed in the first protective insulating film 17A, are provided at the contact portion 22. Further, a contact pad 22C that is formed so as to cover the contact hole 22A is provided at the contact portion 22.

The common electrode line 25 is connected, via the contact hole 22A that is provided in the interlayer insulating film 12, to the contact pad 22C that is formed in the layer of the lower electrode 14. Further, the upper electrode 7 and the common electrode line 25 are electrically connected by covering the contact hole 22B, that is provided in the first protective insulating film 17A, by the upper electrode 7.

Figure 10:
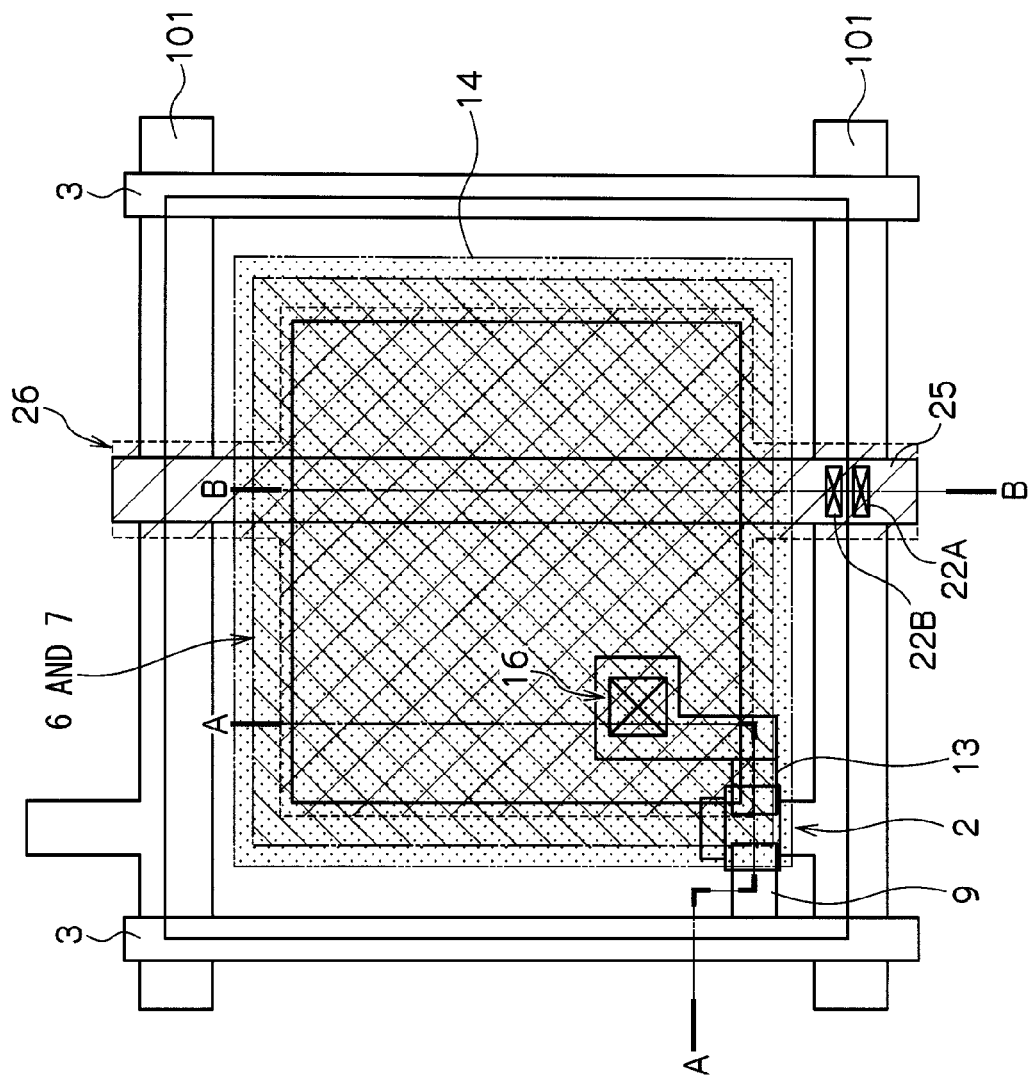
FIG. 10 is a plan view showing the structure of one pixel unit of an electromagnetic wave detecting element relating to another form.
Figure 11A:
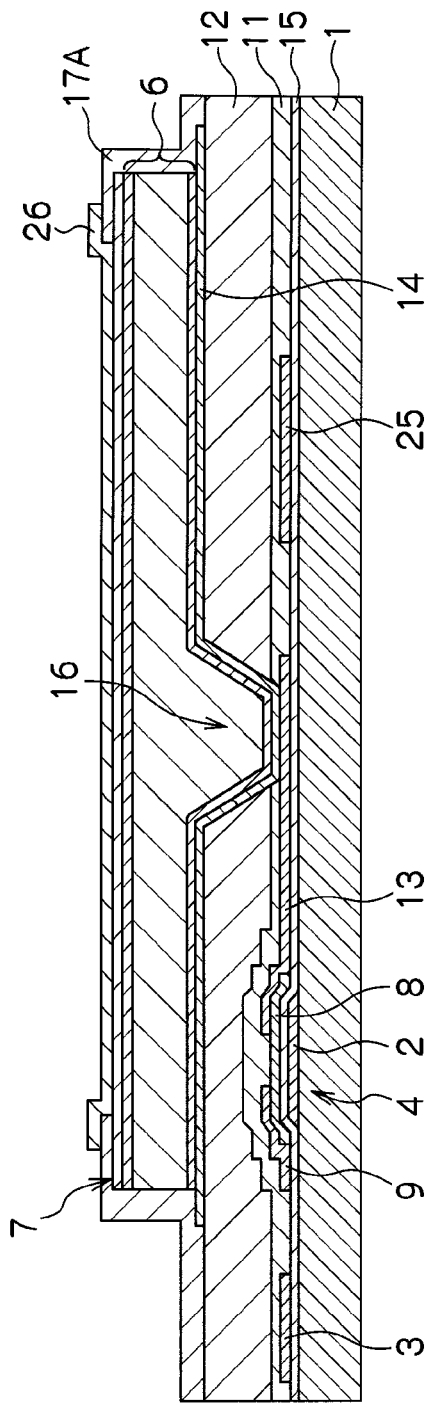
FIG. 11A and FIG. 11B are cross-sectional views of the electromagnetic wave detecting element relating to the exemplary embodiment relating to the other form.
Figure 11B:
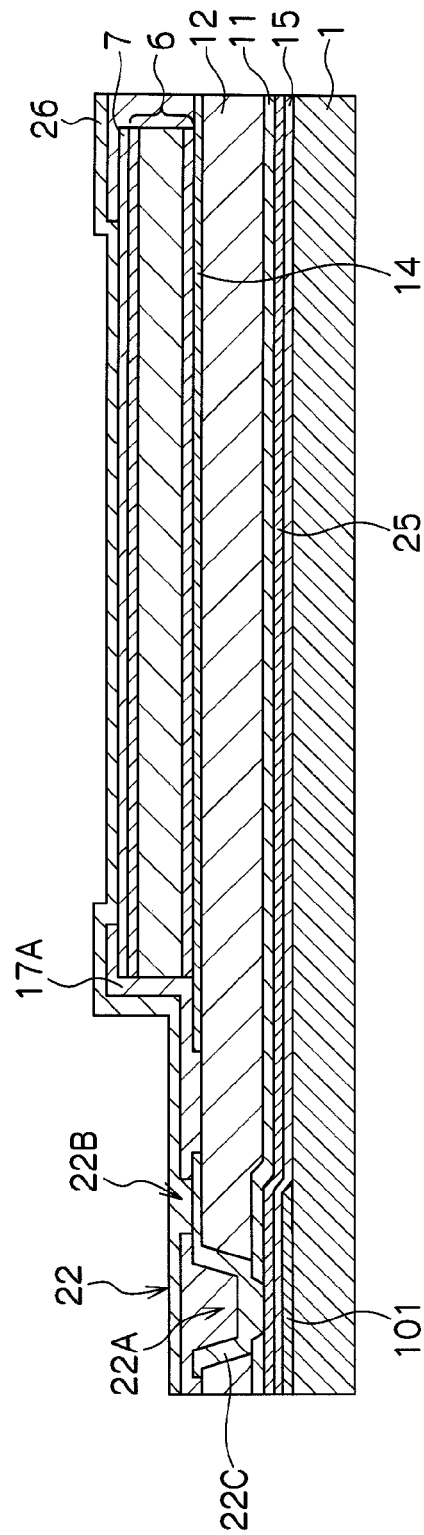
Figure 12:
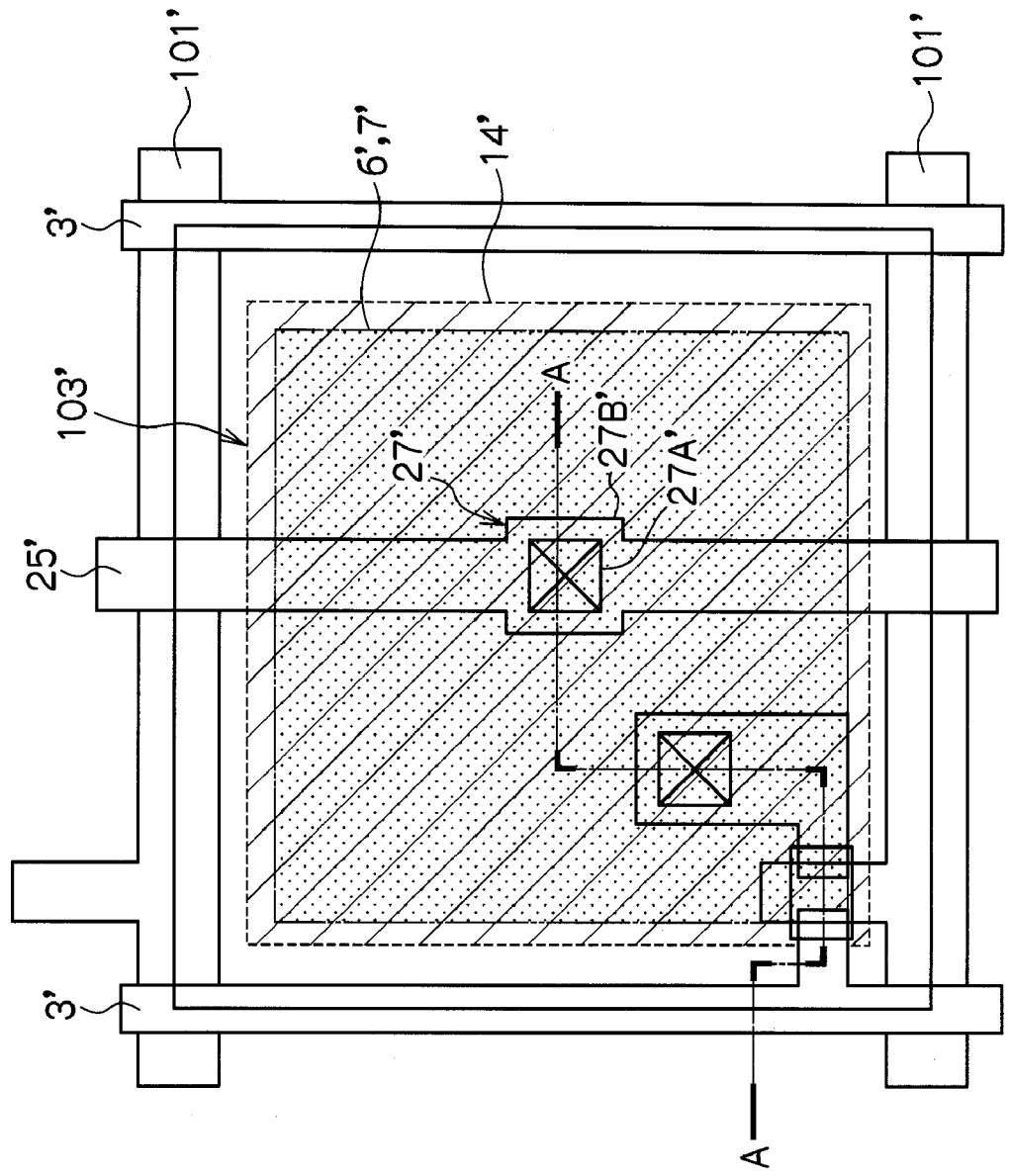
FIG. 12 is a plan view showing the structure of one pixel unit of a conventional electromagnetic wave detecting element.
Figure 13:
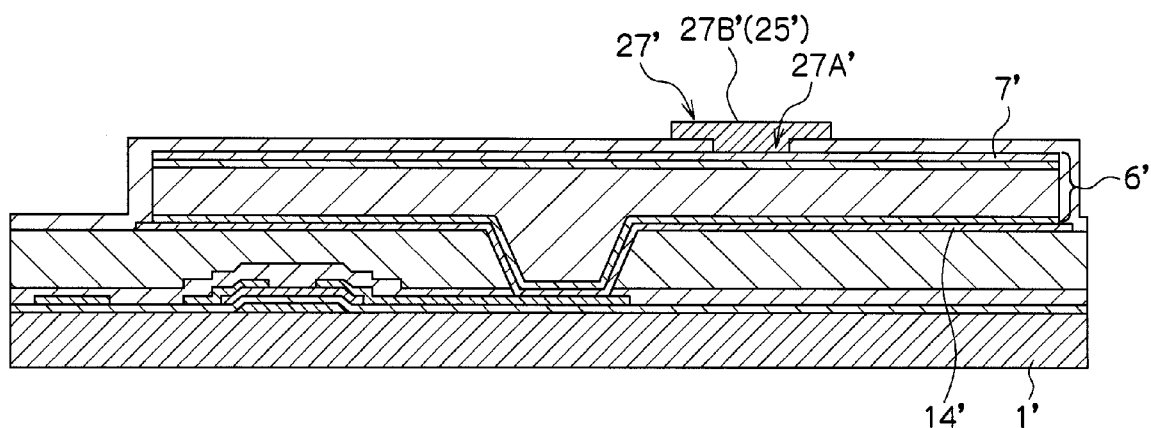
FIG. 13 is a cross-sectional view of the conventional electromagnetic wave detecting element.
Figure 14:
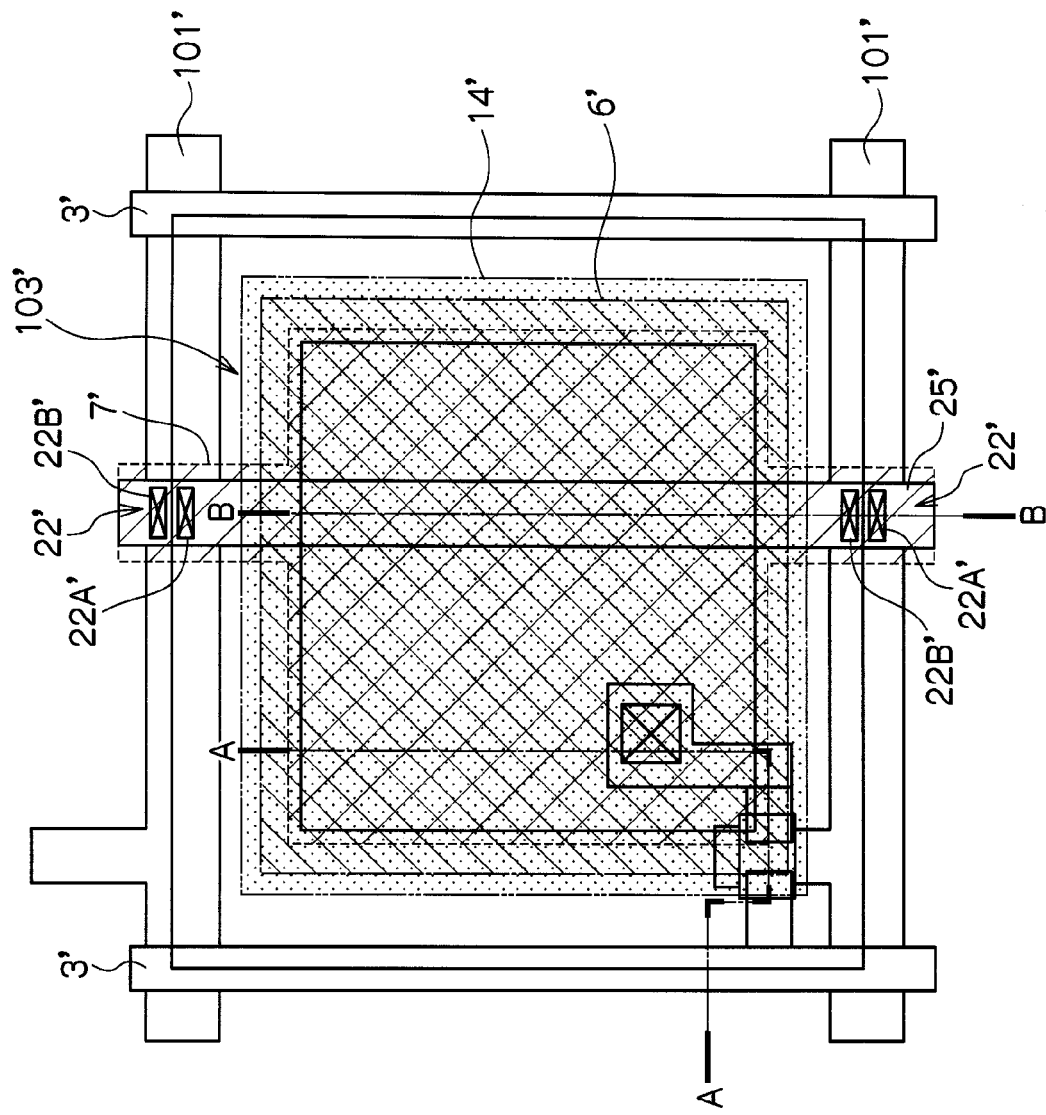
FIG. 14 is a plan view showing the structure of one pixel unit of an electromagnetic wave detecting element in which common electrode lines are disposed at the electromagnetic wave irradiating surface downstream side of semiconductor layer.
Figure 15A:
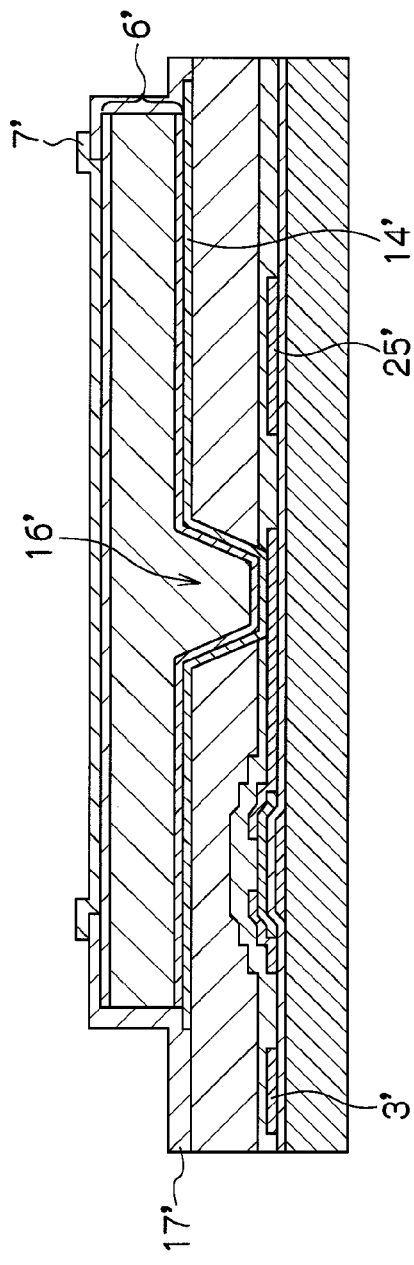
FIG. 15A and FIG. 15B are a cross-sectional view of the electromagnetic wave detecting element in which the common electrode lines are disposed at the electromagnetic wave irradiating surface downstream side of the semiconductor layer.
Figure 15B:
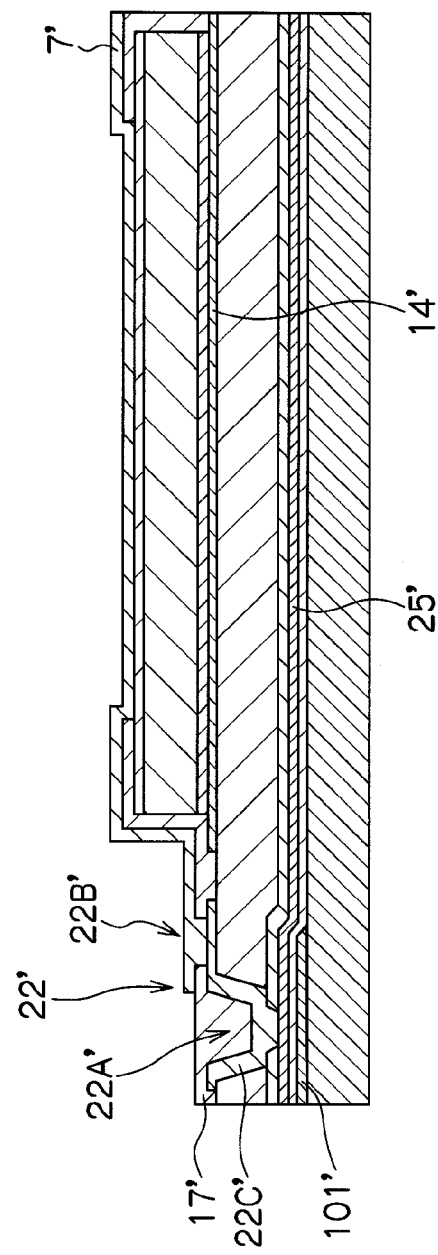

Here, the electrically-conductive member that connects the upper electrode 7 and the common electrode line 25 may be formed by a metal of another layer. For example, in another structural example of the electromagnetic wave detecting element 10 that is shown in FIG. 10 and FIG. 11, the upper electrode 7 and the semiconductor layer 6 are formed integrally in order to decrease the contact resistance between the semiconductor layer 6 and the upper electrode 7. Namely, as shown in FIG. 11A and FIG. 11B, the upper electrode 7 and the semiconductor layer 6 are the same shape. Further, an electrically-conductive member 26, that is connected to the common electrode line 25, is disposed on the opening portion of the first protective insulating film 17A at a layer that is separate from the upper electrode 7. In the same way as the upper electrode 7, a material having high light transmittance such as, for example, ITO or IZO (indium zinc oxide) or the like, is used as this electrically-conductive member 26.

In the present exemplary embodiment, in order to keep the contact resistance between the common electrode line 25 and the upper electrode 7 low, and for the fabricating yield of the photolithographic process at the time of fabricating the electromagnetic wave detecting element 10, the size of the contact portion 22 is made to be 20×20 µm. Further, the semiconductor layer 6 and the lower electrode 14 are formed so as to be separated by a predetermined distance from the contact hole 22A and the contact hole 22B. If this predetermined distance is made to be 10 µm in both the scan line direction and the signal line direction, a region of 30×30 µm where the semiconductor layer 6 and the lower electrode 14 cannot be disposed arises.

As shown in FIG. 6, in the electromagnetic wave detecting element 10 of the present exemplary embodiment as well, portions of the upper electrodes 7 of two sensor portions 103 at a time along the signal line direction are respectively extended, and are formed such that the upper electrodes 7 are electrically connected to one another. Further, in the electromagnetic wave detecting element 10 relating to the present exemplary embodiment, the contact portion 22 is provided at the connection region that electrically connects the upper electrodes 7. By providing the contact portions 22 at the connection regions that electrically connect the upper electrodes 7 in this way, the region of each sensor portion 103 where the semiconductor layer 6 cannot be disposed can be reduced. Therefore, a decrease in the light utilization efficiency can be suppressed.

Moreover, in the electromagnetic wave detecting element 10 relating to the present exemplary embodiment, the semiconductor layer 6 of the two sensor portions 103 whose upper electrodes 7 are connected are formed so as to be substantially line-symmetrical with respect to a boundary line that is the border between these two sensor portions 103. By forming the semiconductor layer 6 so as to be substantially line-symmetrical in this way, the difference in the sensitivities of the two sensor portions 103 can be kept small.

Still further, in the electromagnetic wave detecting element 10 relating to the present exemplary embodiment, the contact portion 22 is provided in a ratio of one per each group of sensor portions 103 whose upper electrodes 7 are electrically connected (in the present exemplary embodiment, two sensor portions 103). Moreover, in the electromagnetic wave detecting element 10 relating to the present exemplary embodiment, the contact portions 22 are disposed in a checkered pattern such that the position at which the contact portion 22 is disposed per line with respect to the scan line direction is offset by one sensor portion 103 at a time in the signal line direction.

Accordingly, in the electromagnetic wave detecting element 10 relating to the present exemplary embodiment, the number of contact portions 22 is one-half of the number of sensor portions 103.

Figure 8:
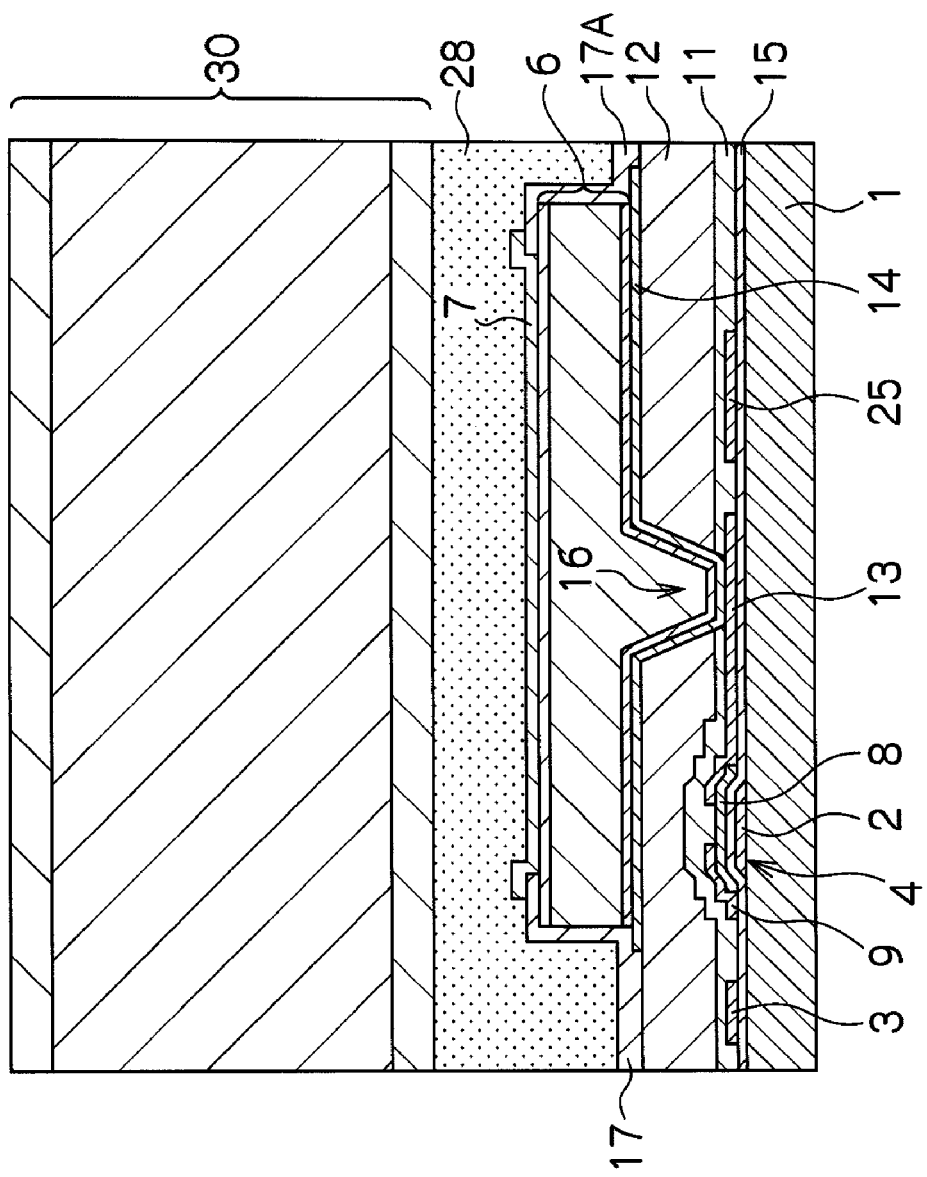
FIG. 8 is a cross-sectional view of the electromagnetic wave detecting element to which a scintillator is affixed, relating to the second exemplary embodiment.

As shown in FIG. 8, the scintillator 30 that is formed of GOS or the like is affixed to the electromagnetic wave detecting element 10 relating to the present exemplary embodiment, by using the adhesive resin 28 having low light absorbance, or the like.

Next, an example of the processes of fabricating the electromagnetic wave detecting element 10 relating to the second exemplary embodiment will be described. Note that, in the following explanation, only the points that differ from the above-described processes of fabricating the electromagnetic wave detecting element 10 of the first exemplary embodiment (FIG. 5) will be explained.

In the electromagnetic wave detecting element 10 relating to the second exemplary embodiment, as shown in FIG. 7A and FIG. 7B, the signal lines 3, the source electrodes 9, the drain electrodes 13, and the common electrode lines 25 are formed as the second signal wiring layer at the top layer of the insulating film 15 and the semiconductor active layers 8.

Further, for the interlayer insulating film 12 that is layered, the interlayer insulating film 12 material that is photosensitive and is a coating material is coated, pre-baked, subjected to exposure, developed, and baked. Then, the TFT protecting film layer 11 that is layered is patterned by a photolithographic technique, and the contact holes 22A are formed.

In the patterning that forms the lower electrodes 14, the lower electrodes 14 and the contact pads 22C are formed.

In the patterning that forms the upper electrodes 7, the upper electrodes 7 are formed such that the lower electrodes 14 and the contact holes 22B are covered by the upper electrodes 7. Due thereto, the connection regions of the common electrode lines 25 are formed.

Then, finally, the scintillator 30 that is formed of GOS is affixed, by using the adhesive resin 28 or the like, to the electromagnetic wave detecting element 10. The electromagnetic wave detecting element 10 shown in FIG. 8 is thereby formed.

In the electromagnetic wave detecting element 10 of the structure in which the common electrode lines 25 are disposed at the electromagnetic wave irradiation surface downstream side of the semiconductor layer 6 as in the present exemplary embodiment, the upper electrodes 7 and the common electrode lines 25 must be connected via the contact portions 22 and the connection regions. Therefore, the semiconductor layer 6 cannot be disposed at regions that are separated by a predetermined distance from the contact portions 22 and the connection regions.

However, in the electromagnetic wave detecting element 10 relating to the present exemplary embodiment, the contact portion 22 is only provided per the two sensor portions 103 whose upper electrodes 7 are connected. Namely, as shown in FIG. 6, only two of the contact portions 22 are disposed with respect to four of the sensor portions 103. Due thereto, the average surface area at which the light, that has been converted into visible light by the scintillator 30 and is illuminated onto the semiconductor layer 6, is cut-off by the contact portions 22 is reduced. Therefore, a decrease in the efficiency of utilizing the light that is illuminated can be suppressed.

Further, in the electromagnetic wave detecting element 10 relating to the present exemplary embodiment, the two contact holes 22A, 22B are needed, which is different than the above-described first exemplary embodiment. Moreover, in the electromagnetic wave detecting element 10 relating to the present exemplary embodiment, a gap of around 5 to 20 μm is needed in order to prevent leak defects between, on the one hand, the contact pads 22C that are formed from a material of the same layer as the lower electrodes 14, and, on the other hand, the lower electrodes 14 and the semiconductor layer 6.

Here, for example, the size of the contact portions 22 is made to be 20×20 μm, and the gap between the contact portions 22 and the semiconductor layer 6 is made to be 5 μm in both the scan line direction (the X direction) and the signal line direction (the Y direction). In this case, a region that is 30×30 μm overall where the semiconductor layer cannot be disposed arises. On the other hand, a gap that electrically separates pixels from one another is needed at the adjacent semiconductor layer 6. In the present exemplary embodiment, the contact portion 22 is set at this region. If the top-bottom gap of the semiconductor layer 6 is made to be 15 μm, the loss surface area of the sensor portion 103 decreases 450 μm$^2$ (=(30−15)(Y)×30(X) μm).

Accordingly, in a case in which the size of the semiconductor layer 6 of each sensor portion 103 is 50×50 μm, the contact portions 22 are provided at the respective sensor portions 103, and bias voltage is applied from the common electrode lines 25 to the upper electrodes 7 of the respective sensor portions 103. In this case, by providing the contact portions 22, the surface area of the semiconductor layer 6 decreases 18% (=450/(50×50)).

On the other hand, in the electromagnetic wave detecting element 10 relating to the present exemplary embodiment, the number of the contact portions 22 is thinned such that the contact portion 22 is provided per two of the sensor portions 103. Therefore, the decrease in the surface area of the semiconductor layer 6 of the respective sensor portions 103 is kept to 9% on average.

In this way, in the electromagnetic wave detecting element 10 relating to the present exemplary embodiment, the contact portions 22 are not disposed at all of the sensor portions 103. Therefore, a decrease in the utilization efficiency of the illuminated light due to the contacts can be suppressed.

Note that the above respective exemplary embodiments describe cases in which the contact portion is provided per two of the sensor portions 103. However, the surface area of the semiconductor layer 6 can be increased by further reducing the number of contact portions.

Further, the above respective exemplary embodiments describe cases in which the upper electrodes 7 of the sensor portions 103 are connected two-by-two. However, the upper electrodes 7 of the sensor portions 103, of a predetermined number that is greater than or equal to two, may be connected at a time along one direction of the scan line direction or the signal line direction. Or, all of the upper electrodes 7 of each line along one direction may be connected.

Moreover, cases are described above in which the position at which the contact portion is disposed per line with respect to the scan line direction is offset by one sensor portion 103 at a time in the signal line direction. However, the position at which the contact portion is disposed may be offset per plural lines. Or, the position at which the contact portion is disposed may be offset by a plural number of the sensor portions 103 at a time.

The above respective exemplary embodiments describe cases in which the sensor portions 103 are arranged in a pattern in which a 2×2 array of the sensor portions 103 in the scan line direction and the signal line direction is repeated. However, the present invention is not limited to the same.

The above first exemplary embodiment describes a case in which the contact portion 22 is provided at the upper portion of the semiconductor layer 6. However, the contact portions 22 may be provided at connection regions that electrically connect the upper electrodes 7 of two contact portions 22. In this way, a decrease in the surface area of the effective regions of the sensor portions 103 due to the contact portions 22 can be suppressed.

Further, in accordance with the above-described respective exemplary embodiments, the common electrode lines 25 are formed parallel to the signal lines 3. Therefore, the signal lines 3 do not intersect the common electrode lines 25, and an increase in the electrostatic capacity of the lines due to the signal lines 3 and the common electrode lines 25 intersecting can be prevented. Thus, electronic noise that is generated at the signal lines 3 can be reduced.

Figure 9:
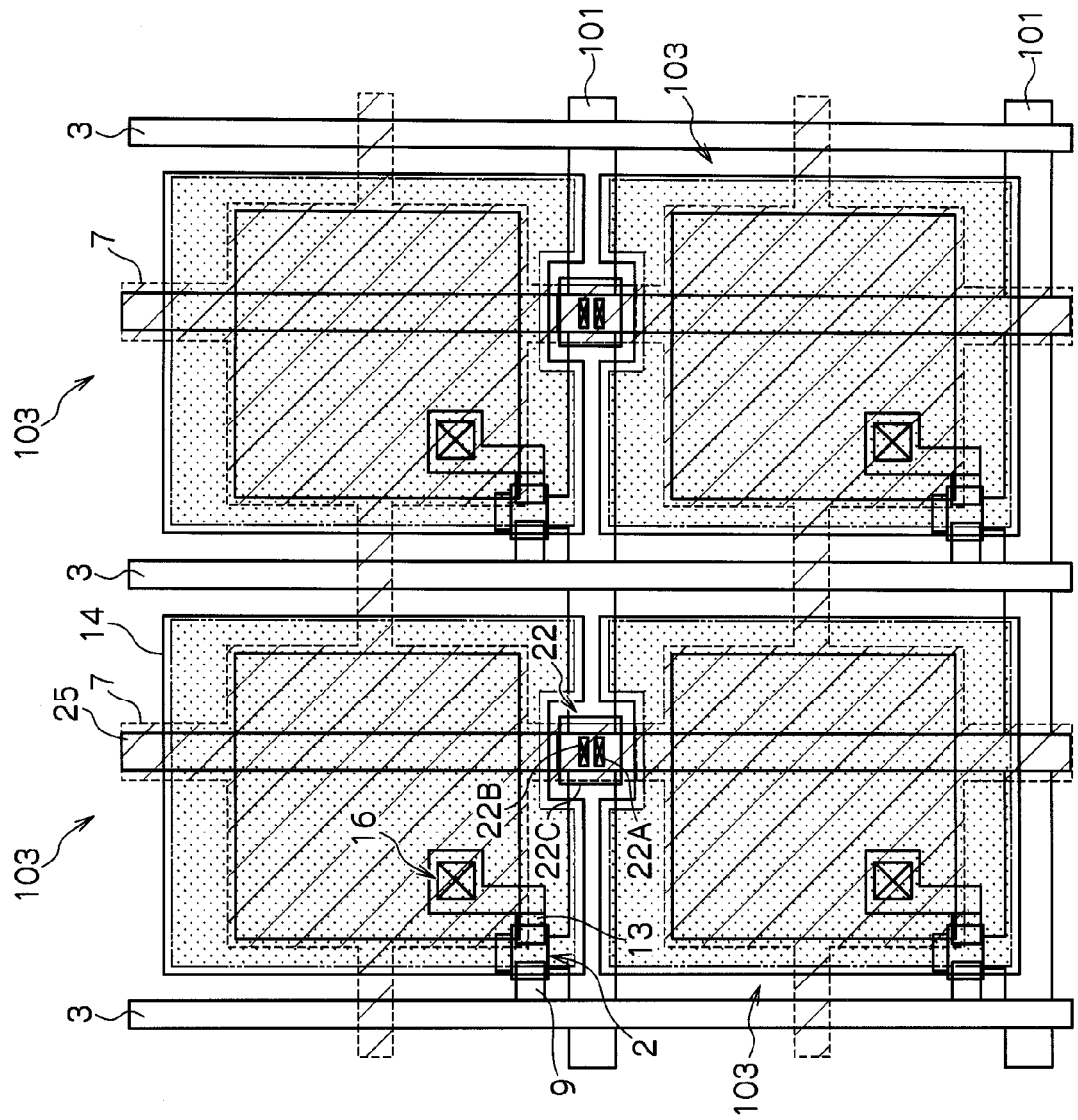
FIG. 9 is a plan view showing another structure of four pixel units of the electromagnetic wave detecting element relating to the second exemplary embodiment.

The above respective exemplary embodiments describe cases in which the upper electrode 7 is connected to the upper electrode 7 of another pixel that is adjacent along the signal line 3. However, the present invention is not limited to the same. For example, as shown in FIG. 9, the upper electrode 7 may be also be connected to the upper electrode 7 of another pixel that is adjacent along the scan line 101. Due thereto, the occurrence of artifacts caused by the electrode potential distribution along the scan line 101 direction can be suppressed. Note that it is possible for the upper electrode 7 to be connected to only the upper electrode 7 of another pixel that is adjacent along the scan line 101.

Cases in which the common electrode lines 25 are formed parallel to the signal lines 3 are described in the above respective exemplary embodiments. However, the present invention is not limited to the same, and, for example, the common electrode lines 25 may be formed parallel to the scan lines 101.

Moreover, the above respective exemplary embodiments describe cases in which the present invention is applied to the indirect-conversion-type electromagnetic wave detecting element 10 that once converts radiation into light at the scintillator 30, and converts the converted light into charges at the semiconductor layer 6 and accumulates the charges. However, the present invention is not limited to the same, and may be applied to, for example, a direct-conversion-type electromagnetic wave detecting element that directly converts radiation into charges at semiconductor layer of amorphous silicon or the like, and accumulates the charges.

In the indirect-conversion-type electromagnetic wave detecting element 10, radiation is converted into light at the scintillator 30, and the light converted at the scintillator 30 is received, and charges are accumulated at the sensor portions 103. Therefore, in the case of an indirect-conversion-type electromagnetic wave detecting element, the electromagnetic waves, that express the image that is the object of detection of the sensor portions of the present invention, are light. Further, at the electromagnetic wave detecting element 10 relating to the present exemplary embodiment, even in a case in which radiation is irradiated from the substrate 1 side, the radiation is converted into light at the scintillator 30, the converted light is illuminated onto the sensor portions 103, and charges are generated at the semiconductor layer 6. Therefore, even in a case in which radiation is irradiated from the substrate 1 side, the irradiation surface sides of the semiconductor layer 6, at which the electromagnetic waves that are the object of detection are irradiated, are the scintillator 30 sides, and the non-irradiation surface sides are the substrate 1 sides.

On the other hand, in a direct-conversion-type electromagnetic wave detecting element, radiation is converted directly into charges at semiconductor layer. Thus, in a direct-conversion-type electromagnetic wave detecting element, the electromagnetic waves, that express the image that is the object of detection of the sensor portions of the present invention, are radiation. Further, in the case of a direct-conversion-type electromagnetic wave detecting element, the radiation is converted directly into charges at the semiconductor layer. Therefore, the irradiation surface sides of the semiconductor layer, at which the electromagnetic waves are irradiated, are the sides at which the radiation is irradiated. Accordingly, the non-irradiation surface sides are the sides at which radiation is not irradiated. For example, if radiation is irradiated from the substrate side, the irradiation surface sides of the semiconductor layer, at which the electromagnetic waves are irradiated, are the substrate sides. Accordingly, the non-irradiation surface sides are the sides of the semiconductor layer that are opposite the sides where the substrate is located.

Moreover, the above respective exemplary embodiments describe cases in which the present invention is applied to the radiation image detection device 100 that detects an image by detecting X-rays as the electromagnetic waves that are the object of detection. However, the present invention is not limited to the same. For example, the electromagnetic waves that are the object of detection may be any of visible light, ultraviolet rays, infrared rays, and the like.

In addition, the structure (see FIG. 1) of the radiation image detection device 100 and the structures (FIG. 2 through FIG. 11) of the electromagnetic wave detecting elements 10, that are described in the above respective exemplary embodiments, are examples. Appropriate changes can, of course, be made thereto within a scope that does not deviate from the gist of the present invention.

What is claimed is:

1. An electromagnetic wave detecting element comprising:
   a plurality of sensor portions, including:
   a semiconductor layer provided in correspondence with respective intersection portions of a plurality of scan lines and a plurality of signal lines that are disposed to intersect one another, the semiconductor layer generating charges due to irradiated electromagnetic waves, that express an image that is an object of detection,
   first electrodes formed by electrically-conductive members, that have transmittance with respect to the electromagnetic waves, at irradiation surface sides of the semiconductor layer to which the electromagnetic waves are irradiated, the first electrodes applying bias voltage to the semiconductor layer,
   second electrodes formed at non-irradiation surface sides of the semiconductor layer with respect to the electromagnetic waves, the second electrodes collecting the charges that are generated at the semiconductor layer,
   wherein one of the first electrodes is electrically connected to any other adjacent first electrode to form a group of sensor portions;
   a common electrode line, provided via the plurality of sensor portions and an insulating film, for supplying the bias voltage; and
   a plurality of contacts provided at the insulating film respectively per group of sensor portions whose first electrodes are electrically connected, and at each of the groups of sensor portions, the contact connects the common electrode line and the first electrode of any sensor portion belonging to that group of sensor portions, via a contact hole formed in the insulating film and at a connection place of a number that is less than a number of sensor portions belonging to that group of sensor portions.

2. The electromagnetic wave detecting element of claim 1, wherein
the common electrode line is provided, via the plurality of sensor portions and the insulating film, at an electromagnetic wave upstream side of the sensor portions, and
the plurality of contacts connecting the first electrodes and the common electrode line via contact holes formed in the insulating film from the electromagnetic wave upstream side.

3. The electromagnetic wave detecting element of claim 1, wherein
the common electrode line is provided, via the plurality of sensor portions and the insulating film, at an electromagnetic wave downstream side of the sensor portions,
the plurality of contacts connecting the first electrodes and the common electrode line via contact holes formed in the insulating film and the sensor portions from the electromagnetic wave downstream side, and
the sensor portions are formed to separate the semiconductor layer and the second electrodes from the contact holes by a predetermined distance.

4. The electromagnetic wave detecting element of claim 1, wherein
at the plurality of sensor portions, the first electrodes are electrically connected along either a scan line direction or a signal line direction, and
the plurality of contacts are provided at an interval of a predetermined number of sensor portions with respect to the one direction, and positions of placement of the plurality of contacts are offset in the selected direction each one line or each plurality of lines with respect to the other direction of the scan line direction or the signal line direction.

5. The electromagnetic wave detecting element of claim 1, wherein the plurality of contacts are provided in a ratio of one contact with respect to two sensor portions.

6. The electromagnetic wave detecting element of claim 5, wherein, at the plurality of sensor portions, two semiconductor layers are formed to be substantially line-symmetrical with respect to a boundary line bounding the two sensor portions.

7. The electromagnetic wave detecting element of claim 1, wherein
a plurality of the common electrode lines are disposed along a signal line direction, and the plurality of sensor portions are disposed to electrically connect the first electrodes along the signal line direction, and connection regions that electrically connect the first electrodes do not intersect the signal lines.

8. The electromagnetic wave detecting element of claim 1, wherein the plurality of contacts are provided at connection regions that electrically connect the first electrodes.

9. The electromagnetic wave detecting element of claim 1, wherein the plurality of sensor portions and the plurality of contacts are disposed in a pattern in which an array of sensor portions, that is greater than or equal to 2×2 sensor portions in a scan line direction and in a signal line direction, is repeated.

10. The electromagnetic wave detecting element of claim 1, wherein the common electrode line has a lower resistance than the electrically-conductive members that form the first electrodes.

11. The electromagnetic wave detecting element of claim 10, wherein the electrically-conductive members are Al or Cu, or are an alloy or a layered film formed including Al or Cu.

12. The electromagnetic wave detecting element of claim 1, wherein
the scan lines are formed from a wiring layer that is formed, via the insulating film, at an electromagnetic wave downstream side of a wiring layer at which the common electrode line is formed, and
the contact holes are formed at positions that are at the irradiation surface sides of regions where the scan lines are formed.

* * * * *